US012665040B2

(12) United States Patent
Li et al.

(10) Patent No.: US 12,665,040 B2
(45) Date of Patent: Jun. 23, 2026

(54) MEMORY DEVICE, MEMORY SYSTEM, AND METHOD OF OPERATING THE SAME USING BIT LINE BIAS VOLTAGE SCHEME

(71) Applicant: YANGTZE MEMORY TECHNOLOGIES CO., LTD., Wuhan (CN)

(72) Inventors: Chenhui Li, Wuhan (CN); Hongtao Liu, Wuhan (CN); Xiangnan Zhao, Wuhan (CN)

(73) Assignee: YANGTZE MEMORY TECHNOLOGIES CO., LTD., Wuhan (CN)

( * ) Notice: Subject to any disclaimer, the term of this patent is extended or adjusted under 35 U.S.C. 154(b) by 105 days.

(21) Appl. No.: 18/672,775

(22) Filed: May 23, 2024

(65) Prior Publication Data

US 2025/0364060 A1      Nov. 27, 2025

(30) Foreign Application Priority Data

May 21, 2024      (CN) .......................... 202410634733.4

(51) Int. Cl.
| | |
|---|---|
| *G11C 16/06* | (2006.01) |
| *G11C 16/08* | (2006.01) |
| *G11C 16/10* | (2006.01) |
| *G11C 16/24* | (2006.01) |
| *G11C 16/34* | (2006.01) |

(52) U.S. Cl.
CPC .......... *G11C 16/3459* (2013.01); *G11C 16/08* (2013.01); *G11C 16/102* (2013.01); *G11C 16/24* (2013.01)

(58) Field of Classification Search
CPC ... G11C 16/3459; G11C 16/08; G11C 16/102; G11C 16/24
USPC ...................................................... 365/185.22
See application file for complete search history.

(56) References Cited

U.S. PATENT DOCUMENTS

| | | | | |
|---|---|---|---|---|
| 9,299,438 | B2 * | 3/2016 | Hara ....................... | G11C 29/28 |
| 11,615,855 | B2 * | 3/2023 | Choi ....................... | G11C 16/24 |
| | | | | 365/185.02 |
| 11,670,374 | B2 * | 6/2023 | Yamada ................. | G11C 16/10 |
| | | | | 365/185.03 |

* cited by examiner

*Primary Examiner* — Tha-O H Bui
(74) *Attorney, Agent, or Firm* — BAYES PLLC

(57)                ABSTRACT

A method of operating a memory device includes applying a first program voltage to a selected word line corresponding to a target group of memory cells, applying a first verify voltage to the selected word line corresponding to the target group of memory cells, applying a pre-determined number of program pulses to the selected word line corresponding to a second memory cell of the target group of memory cells, and applying a first bit line bias voltage to a first bit line corresponding to the second memory cell of the target group of memory cells during applying a first or a last of the pre-determined number of program pulses to the selected word line corresponding to the second memory cell.

20 Claims, 17 Drawing Sheets

100

FIG. 3E

400

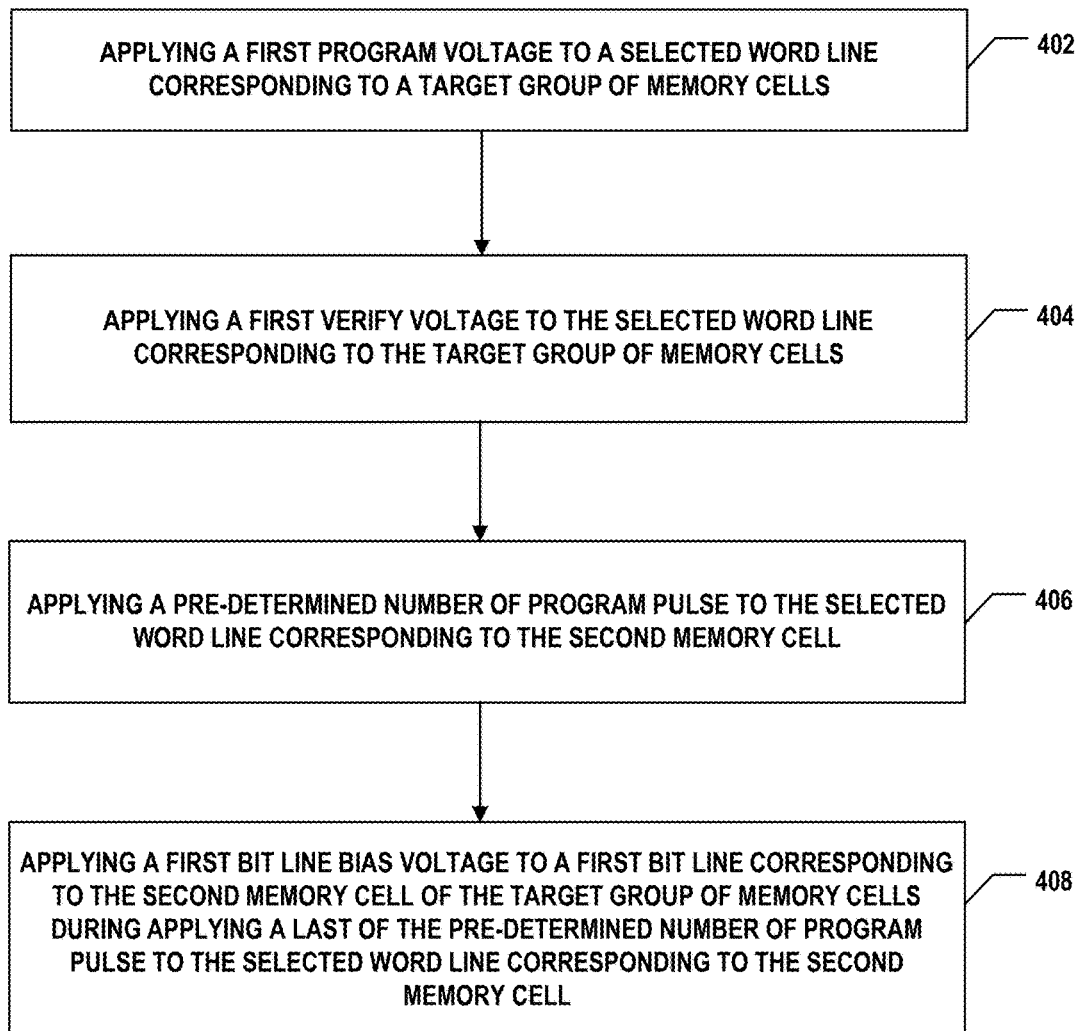

APPLYING A FIRST PROGRAM VOLTAGE TO A SELECTED WORD LINE CORRESPONDING TO A TARGET GROUP OF MEMORY CELLS ⟋— 402

APPLYING A FIRST VERIFY VOLTAGE TO THE SELECTED WORD LINE CORRESPONDING TO THE TARGET GROUP OF MEMORY CELLS ⟋— 404

APPLYING A PRE-DETERMINED NUMBER OF PROGRAM PULSE TO THE SELECTED WORD LINE CORRESPONDING TO THE SECOND MEMORY CELL ⟋— 406

APPLYING A FIRST BIT LINE BIAS VOLTAGE TO A FIRST BIT LINE CORRESPONDING TO THE SECOND MEMORY CELL OF THE TARGET GROUP OF MEMORY CELLS DURING APPLYING A LAST OF THE PRE-DETERMINED NUMBER OF PROGRAM PULSE TO THE SELECTED WORD LINE CORRESPONDING TO THE SECOND MEMORY CELL ⟋— 408

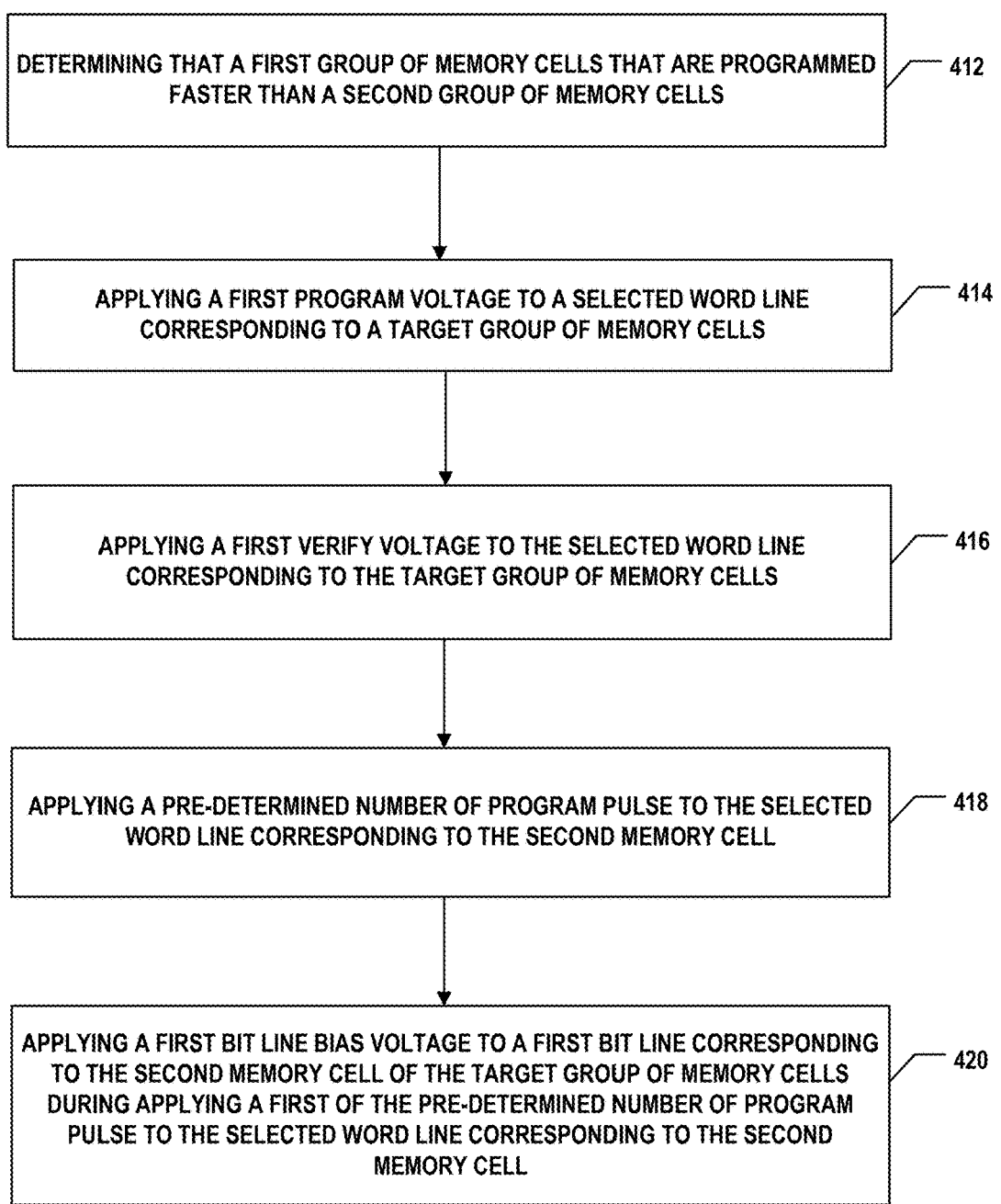

DETERMINING THAT A FIRST GROUP OF MEMORY CELLS THAT ARE PROGRAMMED FASTER THAN A SECOND GROUP OF MEMORY CELLS — 412

APPLYING A FIRST PROGRAM VOLTAGE TO A SELECTED WORD LINE CORRESPONDING TO A TARGET GROUP OF MEMORY CELLS — 414

APPLYING A FIRST VERIFY VOLTAGE TO THE SELECTED WORD LINE CORRESPONDING TO THE TARGET GROUP OF MEMORY CELLS — 416

APPLYING A PRE-DETERMINED NUMBER OF PROGRAM PULSE TO THE SELECTED WORD LINE CORRESPONDING TO THE SECOND MEMORY CELL — 418

APPLYING A FIRST BIT LINE BIAS VOLTAGE TO A FIRST BIT LINE CORRESPONDING TO THE SECOND MEMORY CELL OF THE TARGET GROUP OF MEMORY CELLS DURING APPLYING A FIRST OF THE PRE-DETERMINED NUMBER OF PROGRAM PULSE TO THE SELECTED WORD LINE CORRESPONDING TO THE SECOND MEMORY CELL — 420

FIG. 4B

500
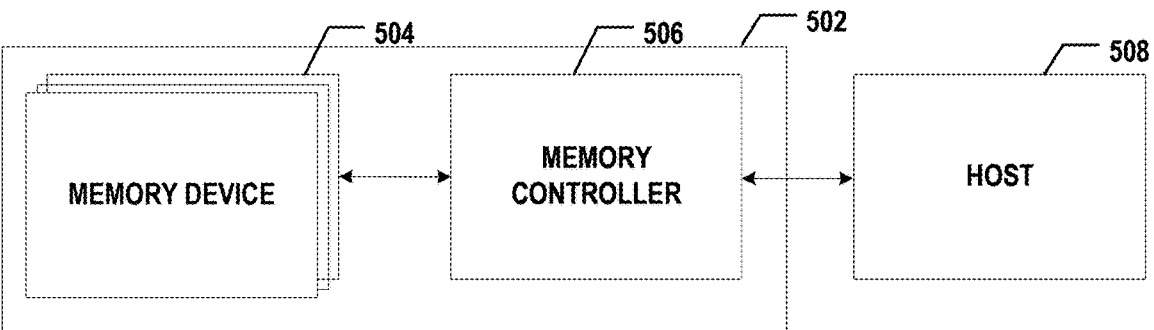
FIG. 5
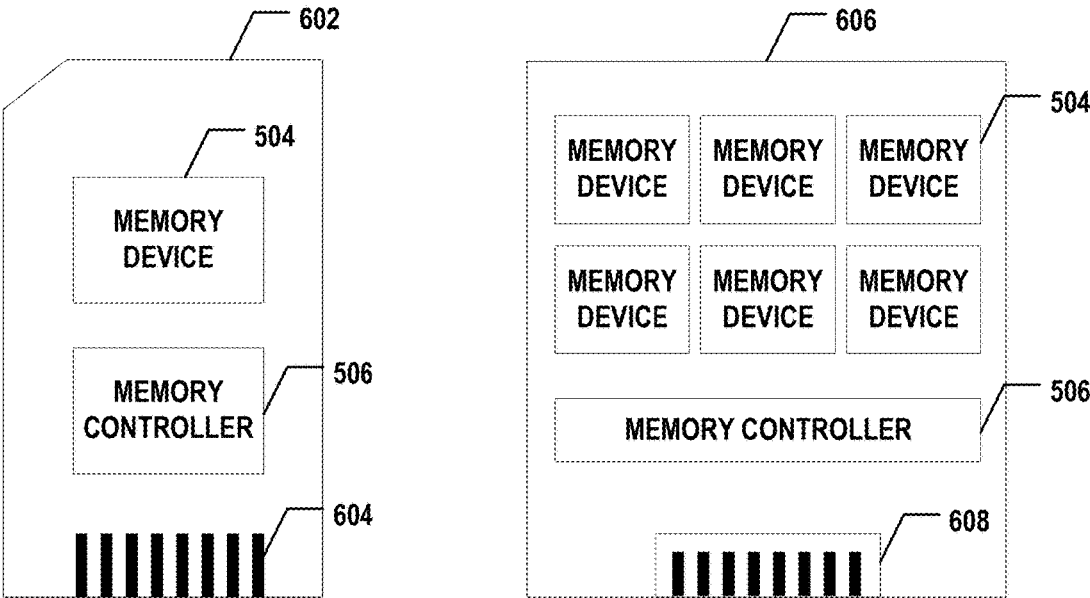
FIG. 6A                              FIG. 6B

MEMORY DEVICE, MEMORY SYSTEM, AND METHOD OF OPERATING THE SAME USING BIT LINE BIAS VOLTAGE SCHEME

CROSS-REFERENCE TO RELATED APPLICATIONS

This application claims the benefit of priority to Chinese Application No. 202410634733.4, filed on May 21, 2024, which is incorporated herein by reference in its entirety.

BACKGROUND

The present disclosure relates to a memory device, a memory system, and a method of operating the same.

Flash memory is a low-cost, high-density, non-volatile solid-state storage medium that can be electrically erased and reprogrammed. Flash memory includes NOR Flash memory and NAND Flash memory. Various operations can be performed by Flash memory, such as read, program (write), and erase. For NAND Flash memory, an erase operation can be performed at the block level, and a program operation or a read operation can be performed at the page level.

SUMMARY

In one aspect, a method of operating a memory device includes: applying a first program voltage to a selected word line corresponding to a target group of memory cells, where the target group of memory cells includes a first memory cell and a second memory cell, a target program state of the first memory cell is a first program state, and a target program state of the second memory cell is a second program state, applying a first verify voltage to the selected word line corresponding to the target group of memory cells, applying a pre-determined number of program pulses to the selected word line corresponding to the second memory cell, and applying a first bit line bias voltage to a first bit line corresponding to the second memory cell of the target group of memory cells during applying a first or a last of the pre-determined number of program pulses to the selected word line corresponding to the second memory cell.

In some implementations, the method further includes: based on cell information of the second memory cell, determining the first bit line bias voltage.

In some implementations, the cell information is obtained before the first memory cell passes a first verification under the first verify voltage.

In some implementations, the first bit line bias voltage is different from a first bit line voltage applied to the first bit line corresponding to the second memory cell of the target group of memory cells during applying the pre-determined number of program pulse other than the first or the last of the pre-determined number of program pulses to the selected word line corresponding to the second memory cell.

In some implementations, the method further includes: in response to that the first memory cell passes a first verification under the first verify voltage, inhibiting programming the first memory cell, in response to that the second memory cell passes the first verification under the first verify voltage, applying the pre-determined number of program pulses to the selected word line corresponding to the second memory cell, and inhibiting programming the second memory cell.

In some implementations, applying a pre-determined number of program pulses to the selected word line corresponding to the second memory cell includes: applying n program pulse to the selected word line corresponding to the (n+1)th memory cell of the target group of memory cells, where n is an integer greater than 0.

In some implementations, the first bit line bias voltage is a 3-bit-line (3BL) bias voltage. Applying the first bit line bias voltage to the first bit line corresponding to the second memory cell of the target group of memory cells is during applying the last of the pre-determined number of program pulse to the selected word line corresponding to the second memory cell.

In some implementations, the 3BL bias voltage is larger than 0V and smaller than 2.2V.

In some implementations, applying the first bit line bias voltage to the first bit line corresponding to the second memory cell of the target group of memory cells is during applying the first of the pre-determined number of program pulse to the selected word line corresponding to the second memory cell.

In some implementations, the first bit line bias voltage is larger than 0V and smaller than 2.2V.

In some implementations, during applying the first of the pre-determined number of program pulses to the selected word line corresponding to the second memory cell, determining the first bit line bias voltage is based on: determining that the first bit line corresponds to a first group of memory cells that are programmed faster than a second group of memory cells, where the target group of memory cells includes the first group of memory cells and the second group of memory cells.

In another aspect, a memory device includes: a memory cell array including memory cells, and a peripheral circuit coupled to the memory cell array. The peripheral circuit is configured to: apply a first program voltage to a selected word line corresponding to a target group of memory cells, where the target group of memory cells includes a first memory cell and a second memory cell, a target program state of the first memory cell is a first program state, and a target program state of the second memory cell is a second program state, apply a first verify voltage to the selected word line corresponding to the target group of memory cells, apply a pre-determined number of program pulses to the selected word line corresponding to the second memory cell, and apply a first bit line bias voltage to a first bit line corresponding to the second memory cell of the target group of memory cells during applying a first or a last of the pre-determined number of program pulses to the selected word line corresponding to the second memory cell.

In some implementations, the peripheral circuit is further configured to: based on cell information of the second memory cell, determine the first bit line bias voltage.

In some implementations, the cell information is obtained before the first memory cell passes a first verification under the first verify voltage.

In some implementations, the first bit line bias voltage is different from a first bit line voltage applied to the first bit line corresponding to the second memory cell of the target group of memory cells during applying the pre-determined number of program pulse other than the first or the last of the pre-determined number of program pulses to the selected word line corresponding to the second memory cell.

In some implementations, the peripheral circuit is further configured to: in response to that the first memory cell passes a first verification under the first verify voltage, inhibiting programming the first memory cell, in response to that the second memory cell passes the first verification under the first verify voltage, applying the pre-determined number of program pulses to the selected word line corresponding to the second memory cell, and inhibiting programming the second memory cell.

In some implementations, the peripheral circuit configured to apply a pre-determined number of program pulses to the selected word line corresponding to the second memory cell is further configured to: apply n program pulse to the selected word line corresponding to the (n+1)th memory cell of the target group of memory cells, where n is an integer greater than 0.

In some implementations, the first bit line bias voltage is a 3-bit-line (3BL) bias voltage. The peripheral circuit is configured to apply the first bit line bias voltage to the first bit line corresponding to the second memory cell of the target group of memory cells during applying the last of the pre-determined number of program pulse to the selected word line corresponding to the second memory cell.

In some implementations, the 3BL bias voltage is larger than 0V and smaller than 2.2V.

In some implementations, the peripheral circuit is configured to apply the first bit line bias voltage to the first line corresponding to the second memory cell of the target group of memory cells during applying the first of the pre-determined number of program pulse to the selected word line corresponding to the second memory cell.

In some implementations, the first bit line bias voltage is larger than 0V and smaller than 2.2V.

In some implementations, during applying the first of the pre-determined number of program pulse to the selected word line corresponding to the second memory cell, the peripheral circuit is configured to determine the first bit line bias voltage based on: determining that the first bit line corresponds to a first group of memory cells that are programmed faster than a second group of memory cells. The target group of memory cells includes the first group of memory cells and the second group of memory cells.

In yet another aspect, a memory system includes: a memory device, and a memory controller coupled to the memory device. The memory device includes: a memory cell array including memory cells, and a peripheral circuit coupled to the memory cell array. The peripheral circuit is configured to: apply a first program voltage to a selected word line corresponding to a target group of memory cells, where the target group of memory cells includes a first memory cell and a second memory cell, a target program state of the first memory cell is a first program state, and a target program state of the second memory cell is a second program state, apply a first verify voltage to the selected word line corresponding to the target group of memory cells, apply a pre-determined number of program pulse to the selected word line corresponding to the second memory cell, and apply a first bit line bias voltage to a first bit line corresponding to the second memory cell of the target group of memory cells during applying a first or a last of the pre-determined number of program pulse to the selected word line corresponding to the second memory cell.

BRIEF DESCRIPTION OF THE DRAWINGS

The accompanying drawings, which are incorporated herein and form a part of the specification, illustrate aspects of the present disclosure and, together with the description, further serve to explain the principles of the present disclosure and to enable a person skilled in the pertinent art to make and use the present disclosure.

FIG. 3E illustrates a threshold voltage (Vt) distribution showing an example voltage scheme applied to the memory device, according to some implementations of the present disclosure.

FIG. 4A illustrates a flowchart of an example method of operating the memory device, according to some implementations of the present disclosure.

FIG. 4B illustrates a flowchart of an example method of operating the memory device, according to some implementations of the present disclosure.

FIG. 5 illustrates a block diagram of an example system having a memory device, according to some implementations of the present disclosure.

FIG. 6A illustrates a diagram of an example memory card having a memory device, according to some implementations of the present disclosure.

FIG. 6B illustrates a diagram of an example solid-state drive (SSD) having a memory device, according to some implementations of the present disclosure.

Figure 1:
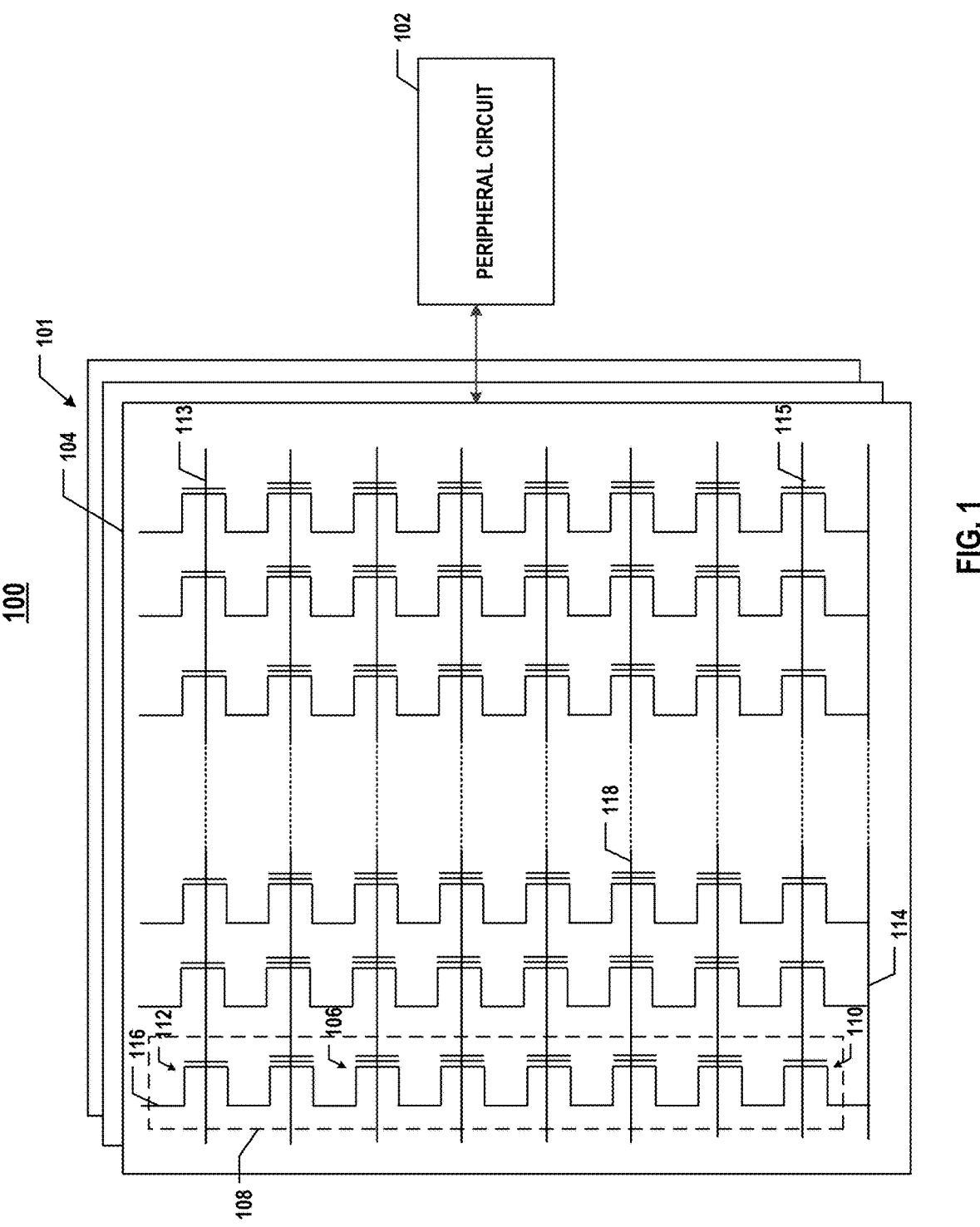
FIG. 1 illustrates a schematic circuit diagram of an example memory device including peripheral circuits, according to some implementations of the present disclosure.

The present disclosure will be described with reference to the accompanying drawings.

DETAILED DESCRIPTION

Although specific configurations and arrangements are discussed, it should be understood that this is done for illustrative purposes only. As such, other configurations and arrangements can be used without departing from the scope of the present disclosure. Also, the present disclosure can also be employed in a variety of other applications. Functional and structural features as described in the present disclosures can be combined, adjusted, and modified with one another and in ways not specifically depicted in the drawings, such that these combinations, adjustments, and modifications are within the scope of the present disclosure.

In general, terminology may be understood at least in part from usage in context. For example, the term "one or more" as used herein, depending at least in part upon context, may be used to describe any feature, structure, or characteristic in a singular sense or may be used to describe combinations of features, structures, or characteristics in a plural sense. Similarly, terms, such as "a," "an," or "the," again, may be understood to convey a singular usage or to convey a plural usage, depending at least in part upon context. In addition, the term "based on" may be understood as not necessarily intended to convey an exclusive set of factors and may, instead, allow for existence of additional factors not necessarily expressly described, again, depending at least in part on context.

As 3D NAND technology advances, more storage bits are being contained in a single cell in an effort to achieve better storage densities. A single cell that contains four bits-Quad-Level Cell (QLC) is currently the most popular technology on the market. To program the memory device in QLC architecture, first and second (e.g., coarse and fine) programming may be performed. Because more programming processes are introduced, a much longer programming time is expected. As such, it is critical to reduce the programming time in the application of QLC architecture.

To address one or more of the aforementioned issues, the present disclosure introduces solutions in which several program schemes are used to program, verify, and inhibit memory cells in an attempt to simplify the processes, thereby reducing the overall programming time. In particular, the present disclosure introduces solutions in which memory cells (e.g., a first memory cell and a second memory cell) corresponding to adjacent program states (e.g., first program state P1 and second program state P2) are grouped and verified by the same verify voltage. After that, a predetermined number of program pulses are applied to the memory cells corresponding to certain program states (e.g., the memory cells corresponding to the adjacent program states except a first memory cell, for example, the second memory cell in the second program state P2). In addition, when applying the first or the last of the pre-determined number of program pulses to the memory cells (e.g., the second memory cell or other memory cells except the first memory cell), a pre-determined bit line bias voltage may be applied to the bit line corresponding to these memory cells. In that way, it can further narrow the threshold voltage (Vt) distribution and reduce the cell-to-cell variation in the voltage distribution.

FIG. 1 illustrates a schematic circuit diagram of a memory device 100 including peripheral circuits, according to some aspects of the present disclosure. Memory device 100 can include a memory cell array 101 and peripheral circuits 102 coupled to memory cell array 101. In some implementations, memory cell array 101 can be a NAND Flash memory cell array in which memory cells 106 are provided in the form of an array of three-dimensional (3D) NAND memory strings 108 each extending vertically above a substrate (not shown). In some implementations, each 3D NAND memory string 108 includes a plurality of memory cells 106 coupled in series and stacked vertically above the substrate. Each memory cell 106 can hold a continuous, analog value, such as an electrical voltage or charge, which depends on the number of electrons trapped within a region of memory cell 106. Each memory cell 106 can be either a floating gate type of memory cell including a floating-gate transistor or a charge trap type of memory cell including a charge-trap transistor. Each array of 3D NAND memory strings 108 can include one or more 3D memory devices.

In some implementations, each memory cell 106 is a single-level cell (SLC) that has two possible memory states and thus, can store one bit of data. For example, the first memory state "0" can correspond to a first range of voltages, and the second memory state "1" can correspond to a second range of voltages. In some implementations, each memory cell 106 is a multi-level cell (MLC) that is capable of storing more than a single bit of data in four or more memory states. For example, the MLC can store two bits per cell, three bits per cell (also known as triple-level cell (TLC)), or four bits per cell (also known as a quad-level cell (QLC)). Each MLC can be programmed to assume a range of possible nominal storage values. In one example, if each MLC stores two bits of data, then the MLC can be programmed to assume one of three possible programming levels from an erased state by writing one of three possible nominal storage values to the cell. A fourth nominal storage value can be used for the erased state.

As shown in FIG. 1, each 3D NAND memory string 108 can include a source select transistor 110 at its source end and a drain select transistor 112 at its drain end. Source select transistor 110 and drain select transistor 112 can be configured to activate selected 3D NAND memory strings 108 (columns of the array) during read and program operations. In some implementations, the sources of source select transistors 110 of 3D NAND memory strings 108 in the same block 104 are coupled through a same source line (SL) 114, e.g., a common SL, for example, to the ground. Drain select transistor 112 of each 3D NAND memory string 108 is coupled to a respective bit line 116 from which data can be read or programmed via an output bus (not shown), according to some implementations. In some implementations, each 3D NAND memory string 108 is configured to be selected or unselected by applying a select signal (e.g., a select voltage above the threshold voltage of drain select transistor 112) or a deselect signal (e.g., a deselect voltage such as 0 V) to respective drain select transistor 112 through one or more drain select lines 113 and/or by applying a select voltage (e.g., above the threshold voltage of source select transistor 110) or a deselect voltage (e.g., 0 V) to respective source select transistor 110 through one or more source select lines 115.

As shown in FIG. 1, 3D NAND memory strings 108 can be organized into multiple blocks 104, each of which can have a common source line 114. In some implementations, each block 104 is the basic data unit for erase operations, i.e., all memory cells 106 on the same block 104 are erased at the same time. Memory cells 106 can be coupled through word lines 118, which select which row of memory cells 106 is affected by read and program operations. In some implementations, each word line 118 is coupled to a row of memory cells 106, which is the basic data unit for program and read operations. Each word line 118 can be coupled to a plurality of control gates (gate electrodes) at each memory cell 106 in a respective row and a gate line coupling the control gates.

Peripheral circuits 102 can be coupled to memory cell array 101 through bit lines 116, word lines 118, source lines 114, source select lines 115, and drain select lines 113. As described above, peripheral circuits 102 can include any suitable circuits for facilitating the operations of memory cell array 101 by applying and sensing voltage signals and/or current signals through bit lines 116 to and from each target memory cell 106 through word lines 118, source lines 114, source select lines 115, and drain select lines 113. Peripheral circuits 102 can include various types of peripheral circuits formed using complementary metal-oxide semiconductor (CMOS) technologies.

Figure 2:
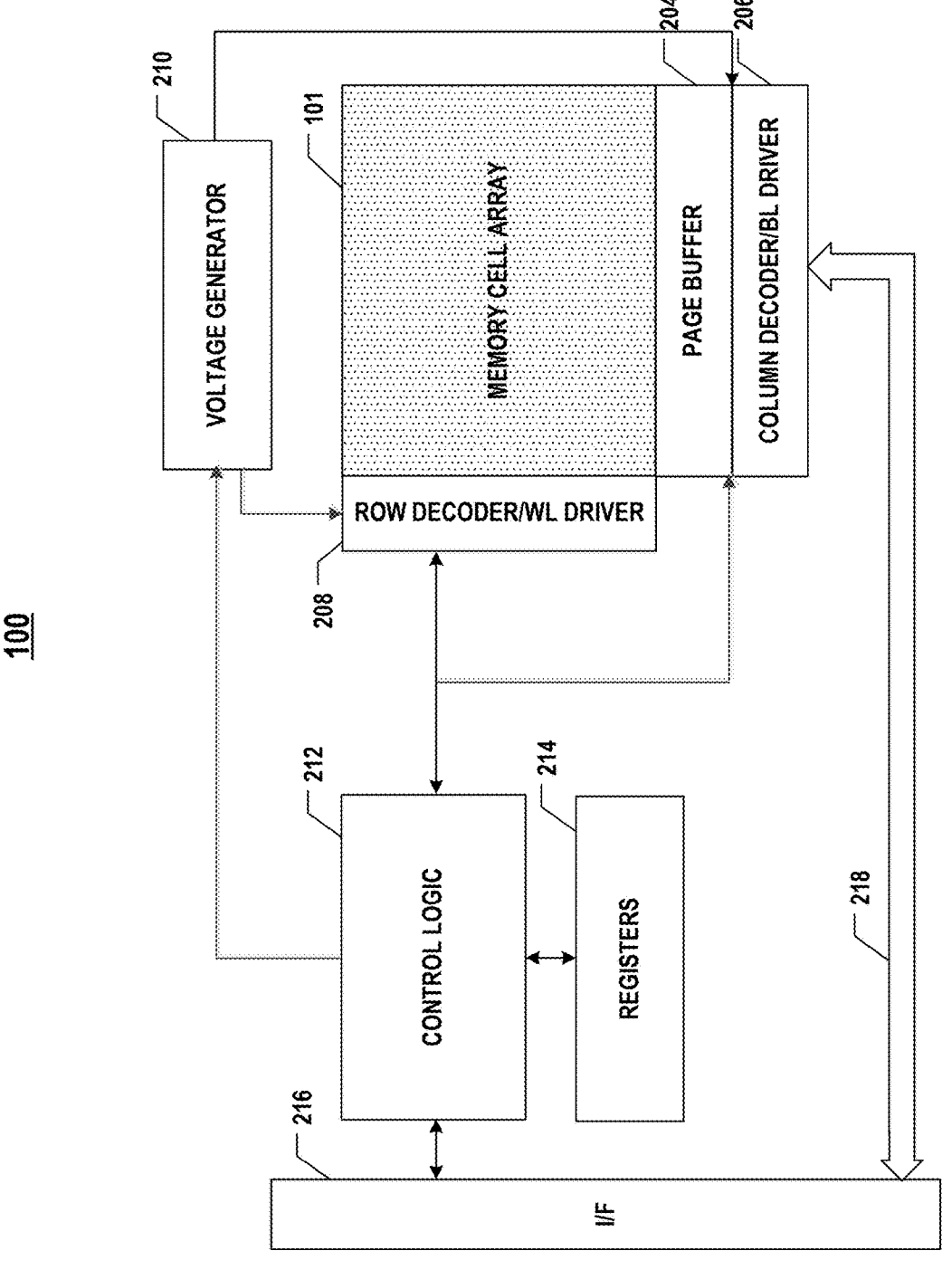
FIG. 2 illustrates a block diagram of an example memory device including a memory cell array and peripheral circuits, according to some implementations of the present disclosure.

FIG. 2 illustrates example peripheral circuits 102 including a page buffer 204, a column decoder/bit line driver 206, a row decoder/word line driver 208, a voltage generator 210, control logic 212, registers 214, an interface (I/F) 216, and a data bus 218. It is understood that in some examples, additional peripheral circuits 102 may be included as well.

Page buffer 204 can be configured to buffer data read from or programmed to memory cell array 101 according to the control signals of control logic 212. In one example, page buffer 204 may store one or more pages of program data (write data) to be programmed into one or more rows of memory cell array 101. In another example, page buffer 204 also performs program verify operations to ensure that the data has been properly programmed into memory cells 106 coupled to selected word lines 118.

Row decoder/word line driver 208 can be configured to be controlled by control logic 212 and select or unselect a block 104 of memory cell array 101 and select or unselect a word line 118 of selected block 104. Row decoder/word line driver 208 can be further configured to drive memory cell array 101. For example, row decoder/word line driver 208 may drive memory cells 106 coupled to the selected word line 118 using a word line voltage generated from voltage generator 210. In some implementations, row decoder/word line driver 208 can include a decoder and string drivers (driving transistors) coupled to local word lines and word lines 118.

Voltage generator 210 can be configured to be controlled by control logic 212 and generate the word line voltages (e.g., read voltage, program voltage, pass voltage, local voltage, verify voltage, etc.) to be supplied to memory cell array 101. In some implementations, voltage generator 210 is part of a voltage source that provides voltages at various levels of different peripheral circuits 102 as described below in detail. Consistent with the scope of the present disclosure, in some implementations, the voltages provided by voltage generator 210, for example, to row decoder/word line driver 208 and page buffer 204 are above certain levels that are sufficient to perform the memory operations. For example, the voltages provided to page buffer 204 may be between 2 V and 3.3 V, such as 3.3 V, and the voltages provided to row decoder/word line driver 208 may be greater than 3.3 V, such as between 3.3 V and 30 V.

Column decoder/bit line driver 206 can be configured to be controlled by control logic 212 and select one or more 3D NAND memory strings 108 by applying bit line voltages generated from voltage generator 210. For example, column decoder/bit line driver 206 may apply column signals for selecting a set of N bits of data from page buffer 204 to be output in a read operation.

Control logic 212 can be coupled to each peripheral circuit 102 and configured to control operations of peripheral circuits 102. Registers 214 can be coupled to control logic 212 and include status registers, command registers, and address registers for storing status information, command operation codes (OP codes), and command addresses for controlling the operations of each peripheral circuit 102.

Control logic 212 is configured to control the operations in the implementations of the present disclosure. For instance, control logic 212 is configured to control voltage generator 210 to apply word line voltages to implement the voltage schemes disclosed in the present disclosure.

Interface 216 can be coupled to control logic 212 and configured to interface memory cell array 101 with a memory controller (not shown). In some implementations, interface 216 acts as a control buffer to buffer and relay control commands received from the memory controller and/or a host (not shown) to control logic 212 and status information received from control logic 212 to the memory controller and/or the host. Interface 216 can also be coupled to page buffer 204 and column decoder/bit line driver 206 via data bus 218 and act as an Input/Output (I/O) interface and a data buffer to buffer and relay the program data received from the memory controller and/or the host to page buffer 204 and the read data from page buffer 204 to the memory controller and/or the host. In some implementations, interface 216 and data bus 218 are part of an I/O circuit of peripheral circuits 102.

Figure 3A:
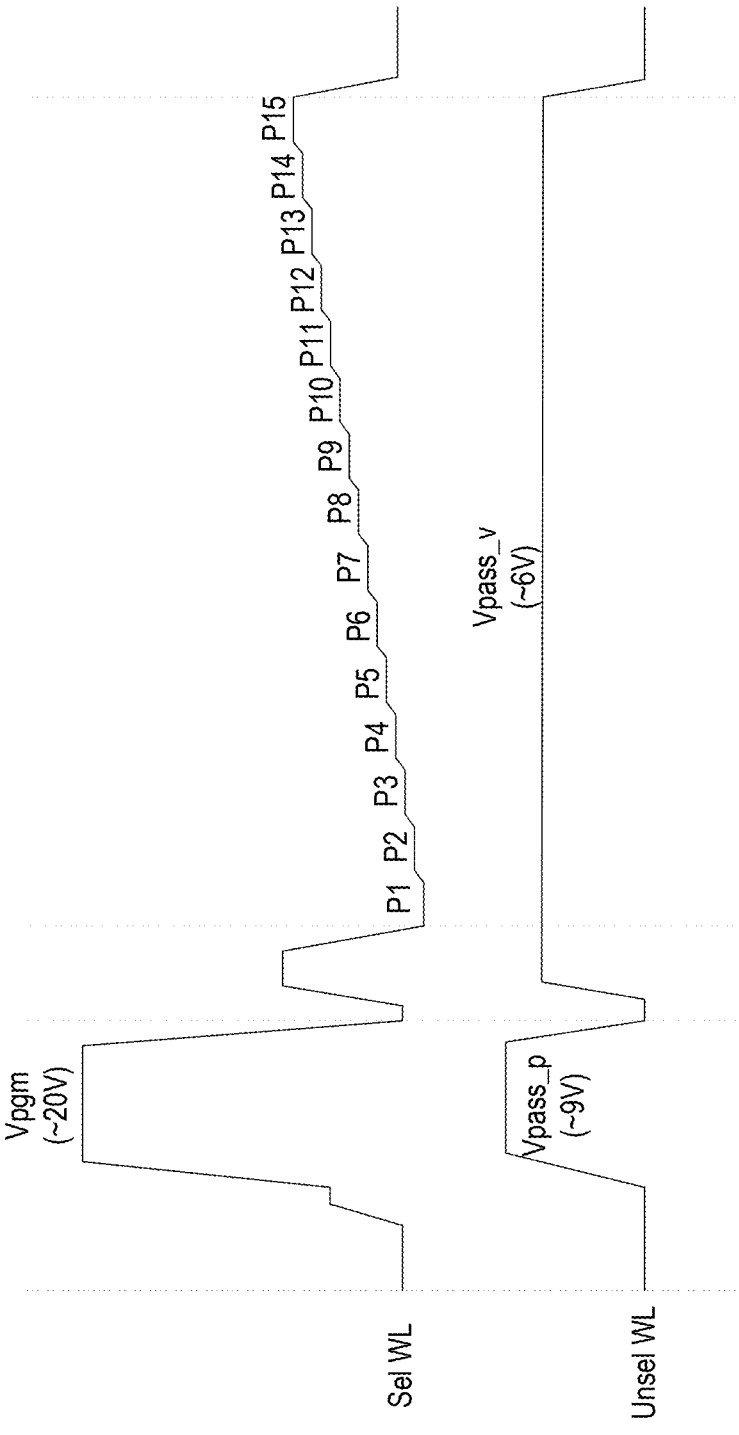
FIG. 3A illustrates an example voltage scheme applied to the memory device, according to some implementations of the present disclosure.

FIG. 3A illustrates an example voltage scheme applied to the memory device, according to some implementations of the present disclosure. As shown in FIG. 3A, during a first program operation, a program voltage (Vpgm) is applied to a selected word line corresponding to selected memory cells during a program phase. A pass voltage during the program phase (Vpass_p) can be applied to unselected word lines corresponding to unselected memory cells. During a verification phase, one or more verify voltages corresponding to one or more program states (e.g., first program state P1, second program state P2, . . . , and fifteenth program state P15) are applied to the selected word line corresponding to the selected memory cells. In the meanwhile, a pass voltage during the verification phase (Vpass_v) can be applied to the unselected word lines corresponding to the unselected memory cells. In some implementations, the program voltage Vpgm is between 10 V to 30 V. For example, the program voltage may include 10, 11, 12, 13, 14, 15, 16, 17, 18, 19, 20, 21, 22, 23, 24, 25, 26, 27, 28, 29, or 30 V. In some implementations, the pass voltage during the program phase Vpass_p is between 9V and 12V. For example, the Vpass_p may include 9.0, 9.1, 9.2, 9.3, 9.4, 9.5, 9.6, 9.7, 9.8, 9.9, 10.0, 10.1, 10.2, 10.3, 10.4, 10.5, 10.6, 10.7, 10.8, 10.9, 11.0, 11.1, 11.2, 11.3, 11.4, 11.5, 11.6, 11.7, 11.8, 11.9, or 12.0 V. In some implementations, the pass voltage during the verification phase Vpass_v is between 6V and 9V. For example, the Vpass_v may include 6.0, 6.1, 6.2, 6.3, 6.4, 6.5, 6.6, 6.7, 6.8, 6.9, 7.0, 7.1, 7.2, 7.3, 7.4, 7.5, 7.6, 7.7, 7.8, 7.9, 8.0, 8.1, 8.2, 8.3, 8.4, 8.5, 8.6, 8.7, 8.8, 8.9, or 9.0 V. Although FIG. 3A illustrates 15 verify voltages for verifying 15 program states, it is understood that FIG. 3A is for illustrative purposes only and does not represent the actual waveform of a verify voltage applied to the select word line in the verification phase. For example, the 15 program stats may not all be verified after applying one program voltage. In some implementations, one of the verify voltages may be applied after one program voltage. In other implementations, some of the verifications may be omitted, for example, two program voltages are applied with one verify voltage only.

Figure 3B:
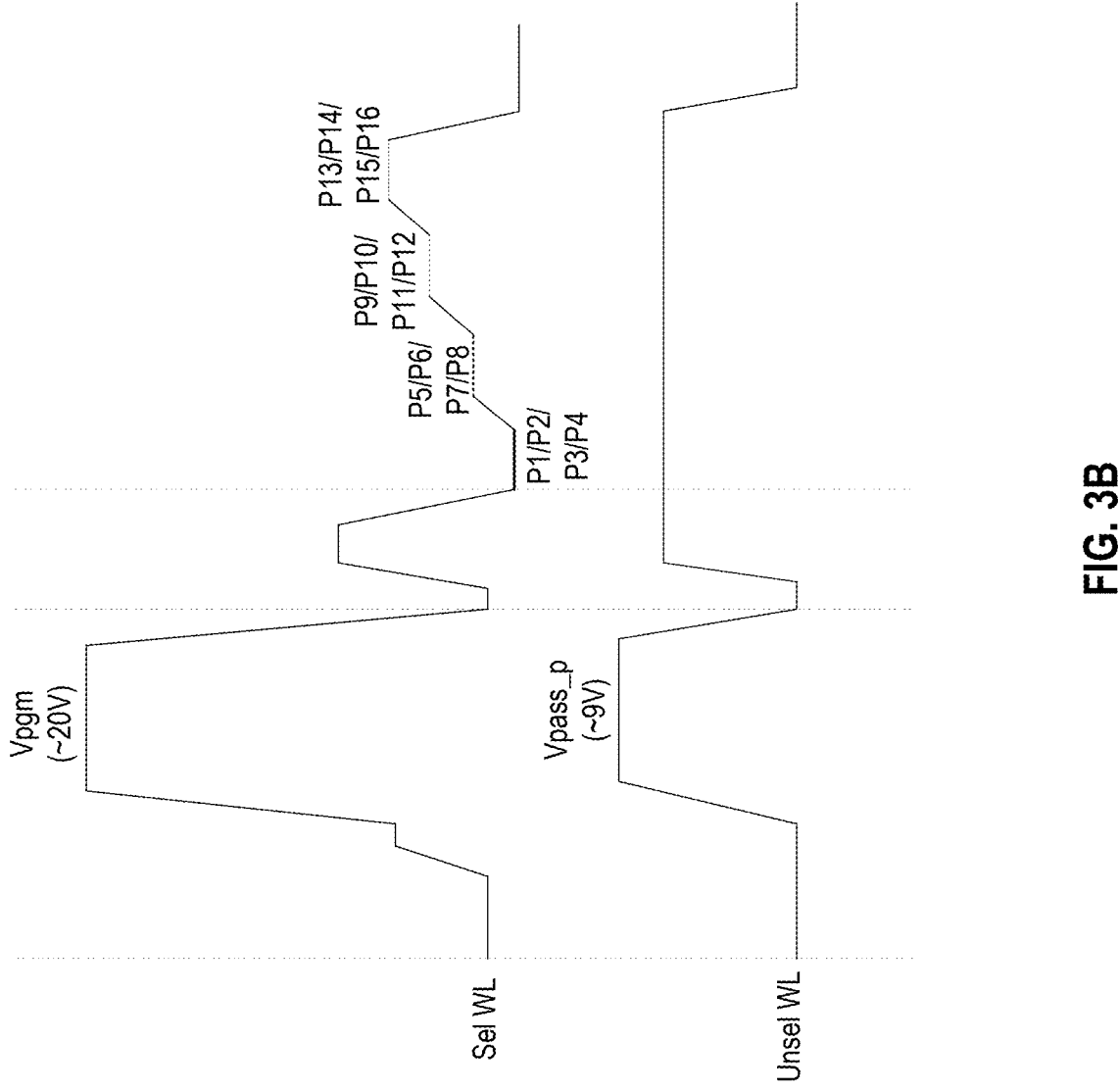
FIG. 3B illustrates another example voltage scheme applied to the memory device, according to some implementations of the present disclosure.
Figure 3C:
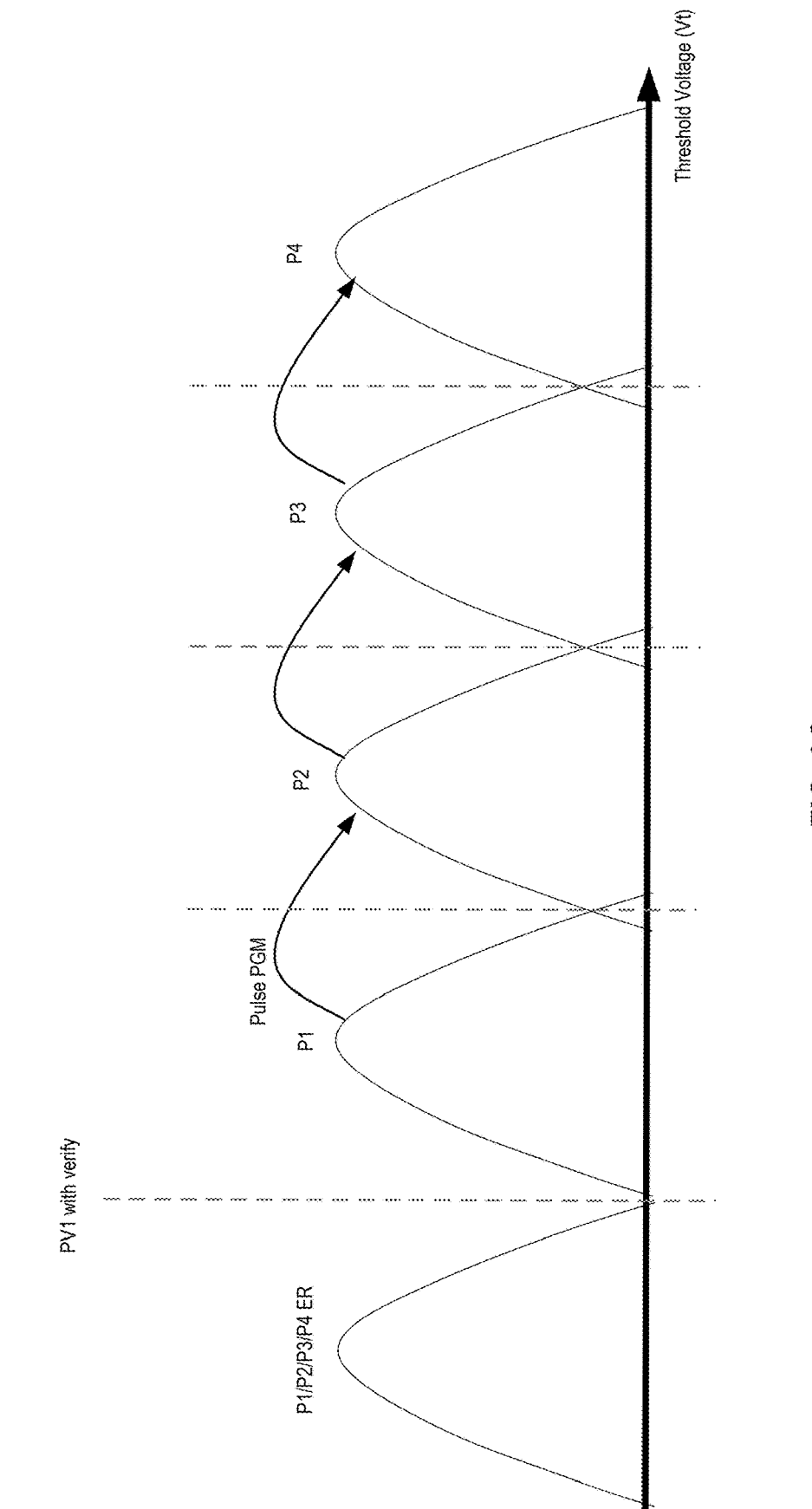
FIG. 3C illustrates a Vt distribution showing an example voltage scheme applied to the memory device, according to some implementations of the present disclosure.

To further reduce the process flow and the process time of verification, as shown in FIG. 3B, the memory cells corresponding to pre-determined program states are grouped and the same verify voltage is applied to the memory cells of the same group of program state. For example, a first program voltage is applied to a selected word line corresponding to a first target group of memory cells, and a second program voltage is applied to the selected word line corresponding to a second target group of memory cells, etc. The first target group of memory cells, for example, include a first memory cell, a second memory cell, a third memory cell, and a fourth memory cell. A target program state of the first memory cell is a first program state, a target program state of the second memory cell is a second program state, a target program state of the third memory cell is a third program state, and a target program state of the fourth memory cell is a fourth program state. For example, as shown in FIG. 3C, four memory cells corresponding to four program states (P1/P2/P3/P4) are in an erase state (ER) before they are programmed into their respective program states (P1/P2/P3/P4). It is noted that the memory cells may be programmed to their respective intermediate program states after the first program operation (i.e., a coarse programming by applying at least one program pulse), and a second program operation (e.g., a fine programming) may be needed to program the memory cells to their corresponding target program states.

Next, a first verify voltage is applied to the selected word line corresponding to the first target group of memory cells. That is, the first, second, third, and fourth memory cells are applied with the first verify voltage and pass the verification. After memory cells are programmed and pass the verification with the first verify voltage, the threshold voltages of the four memory cells are all distributed at least in the first program state. In some implementations, these four memory cells that pass the verification with the first verify voltage are not verified again after applying program pulses, thereby reducing the time for additional verifications. For instance, the bit lines coupled to these four memory cells are applied with a verify prohibit voltage (e.g., 0V or lower than certain bit line voltages during the normal verification process), such that these four memory cells are not verified during the subsequent verification. On the contrary, the memory cells that do not pass the verification are programmed as usual in the subsequent program operation.

Next, a pre-determined number of program pulses is applied to the selected word line corresponding to memory cells (e.g., the second memory cell, the third memory cell, or the fourth memory cell). While the selected word line is applied with program pulses, the first memory cell is program prohibited (e.g., by applying a program prohibit voltage, for example, a high voltage Vdd, to a bit line that coupled to the first memory cell). After the second memory cell is applied with one program pulse, the second memory cell is program prohibited (e.g., by applying a program prohibit voltage to a bit line coupled to the second memory cell). After the third memory cell is applied with two program pulses, the third memory cell is program prohibited (e.g., by applying a program prohibit voltage to a bit line coupled to the third memory cell). Next, the fourth memory cell is applied with the third program pulse (i.e., three program pulses in total). As such, after the four memory cells are applied with corresponding program pulses and passed the verification with the first verify voltage, the threshold voltages of the four memory cells are all distributed at least in their corresponding intermediate program states. Next, an additional program process such as a second program operation (e.g., a fine programming) may be applied to the four memory cells so that the four memory cells can be programmed to their corresponding target program states. In some implementations, each (n+1)th memory cell is applied with n program pulses, where n is an integer greater than 0. For instance, in implementations that the first target group of memory cells include two memory cells, a second memory cell is applied with one program pulse after the verification. In implementations that the first target group of memory cells include four memory cells, the second memory cell is applied with one program pulse, the third memory cell is applied with two program pulses, and the fourth memory cell is applied with three program pulses. In some implementations, at least one memory cell of the nth memory cell is applied with at least one program pulse. The greater n is, the more program pulses are applied to the nth memory cells. For example, the fourth memory cell receives more program pulses than the third memory cell, second memory cell, or first memory cell.

Figure 3D:
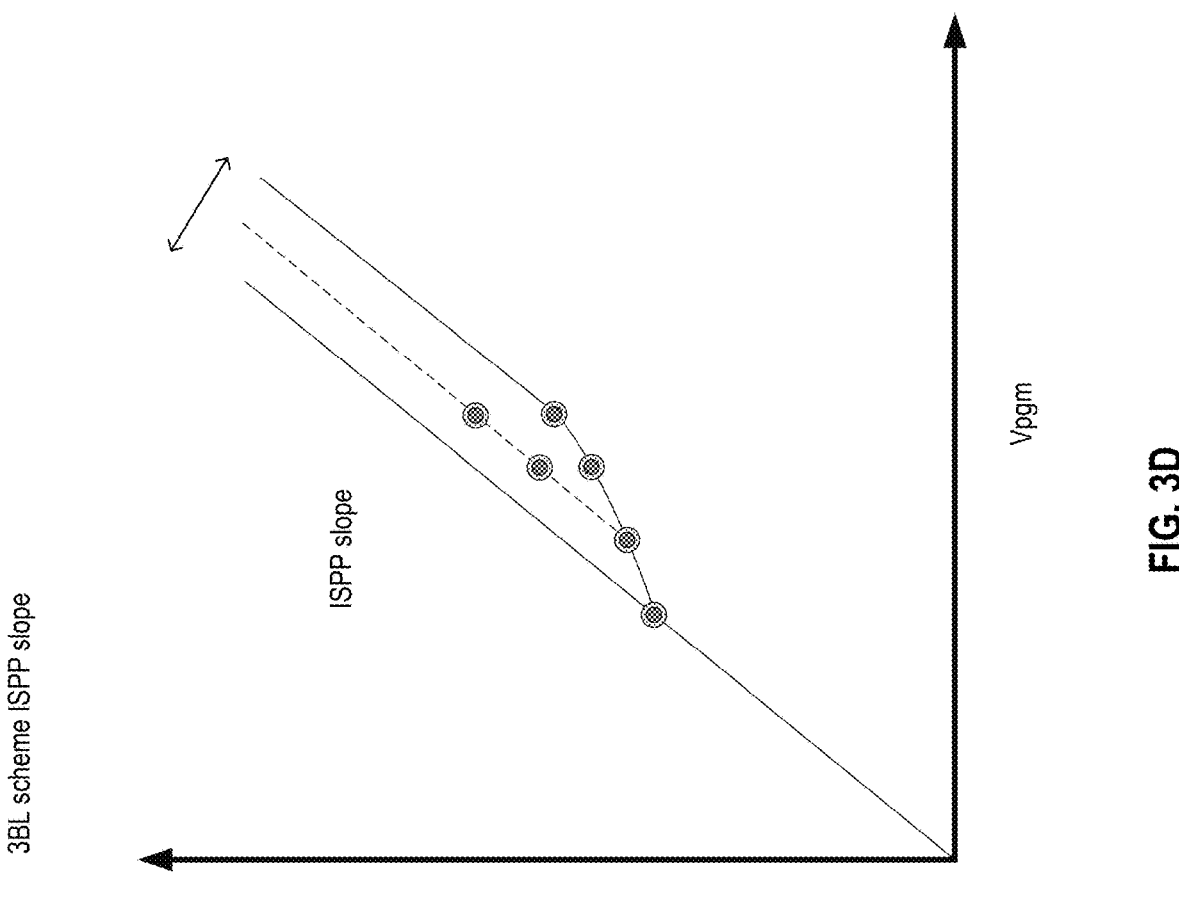
FIG. 3D illustrates a chart showing the slopes of example voltage schemes applied to the memory device, according to some implementations of the present disclosure.

In some implementations, a 3-bit-line (3BL) bias voltage scheme is applied to all the bit lines corresponding to the selected memory cell during applying the program pulses. However, as shown in FIG. 3E, each time the program pulse is applied to the memory cells under the 3BL bias voltage scheme, the threshold voltage Vt distribution becomes narrower. That is, the slope of the incremental step programming pulse (ISPP) becomes smaller and cannot be recovered, as shown in FIG. 3D. When the slope becomes smaller, the program time for each memory becomes slower. This slow program issue leads to longer program time, thereby reducing the programming efficiency.

To address this slow program issue, a first bit line bias voltage is applied to bit lines (e.g., a first bit line) corresponding to memory cells except the first memory cell (e.g., the second memory cell) of the target group of memory cells during applying a first or a last of the pre-determined number of program pulse to the selected word line corresponding to the second memory cell. For example, in implementations that the first target group of memory cells include four memory cells, the second memory cell is applied with one program pulse, the third memory cell is applied with two program pulses, and the fourth memory cell is applied with three program pulses.

Figure 3F:
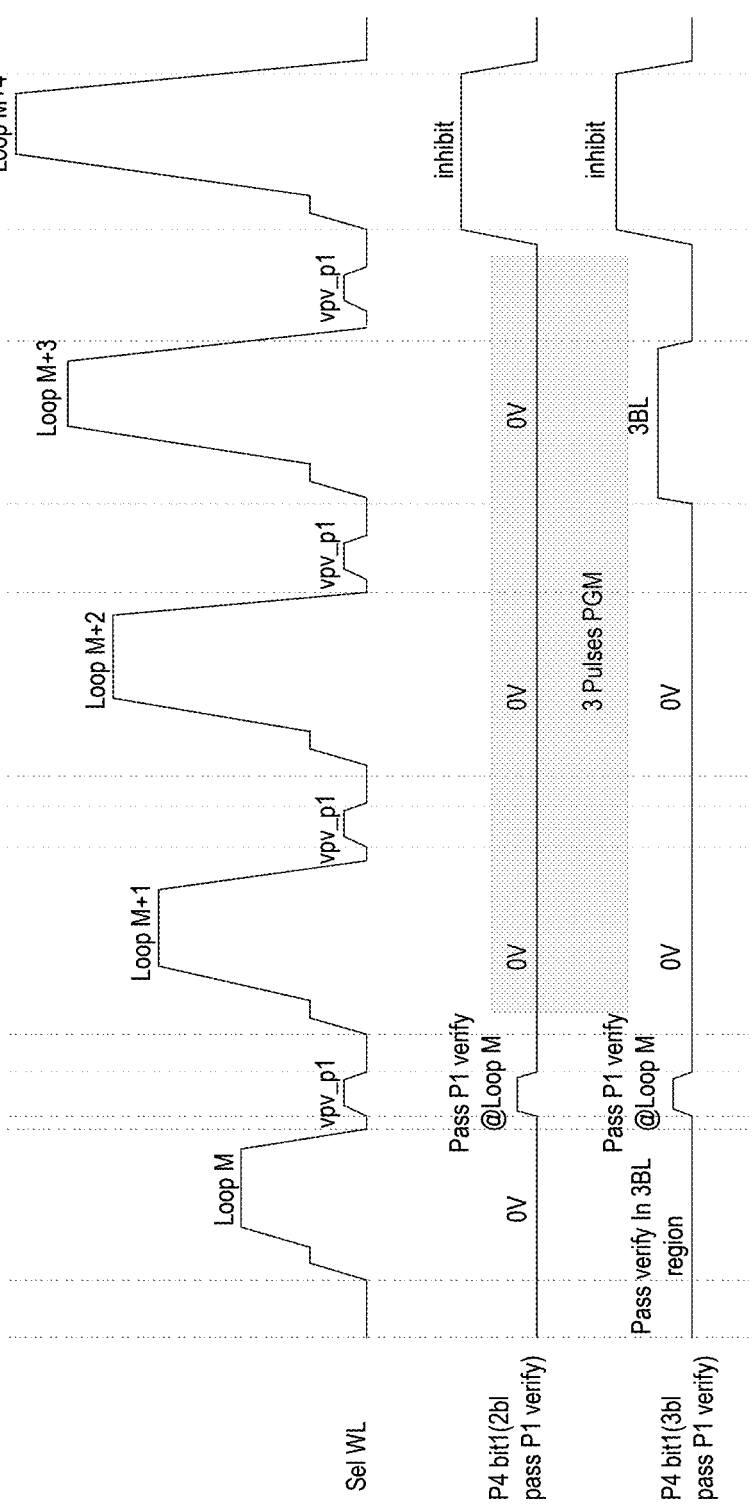
FIG. 3F illustrates an example voltage scheme applied to the memory device, according to some implementations of the present disclosure.

In some implementations, as shown in FIG. 3F, the first bit line bias voltage is applied to memory cells only during the last of the program pulses being applied to the memory cells. For example, the first bit line bias voltage is applied to a first bit line corresponding to the second memory cell during applying the last (e.g., the only one) program pulse to the second memory cell. The first bit line bias voltage is applied to the first bit line corresponding to the third memory cell during applying the last (e.g., the second) program pulse to the third memory cell. And the first bit line bias voltage is applied to the first bit line corresponding to the fourth memory cell during applying the last (e.g., the third) program pulse to the fourth memory cell. The default bit line bias voltage is applied to the memory cells during applying the rest of the pre-determined number of program pulses to the memory cells. In some implementations, the default bit line bias voltage is 0V.

As shown in FIG. 3F, taking the fourth memory cell corresponding to the fourth program state, for example, after the fourth memory cell is programmed and later is verified under a first verify voltage for the first program state, three program pulses are applied to the fourth memory cell. And during the last (e.g., the third) program pulse being applied to the fourth memory cell, a 3BL voltage is applied to the first bit line corresponding to the fourth memory cell. And after the verification and applying program pulses, the fourth memory cell is inhibited from programming in the subsequent program phase by applying a program inhibit signal to the bit line corresponding to the fourth memory cell. As shown in FIG. 3H, during the verification and the application of first two program pulses, the 3BL bias voltage scheme is disable, during applying the last program pulse, the 3BL bias voltage scheme is enabled. As such, each Vt distribution for memory cells (e.g., memory cells in program states P2, P3, and P4) is only slightly compressed and does not decrease the speed of programming significantly. The slow program issue is, therefore, minimized. These memory cells that pass the verification with the first verify voltage are not verified again after applying program pulses, thereby reducing the time for additional verifications. For instance, the bit lines coupled to these memory cells are applied with a verify prohibit voltage (e.g., 0V or lower than default bit line voltages during the verification process), such that these memory cells are not verified during the subsequent verification.

Figure 3G:
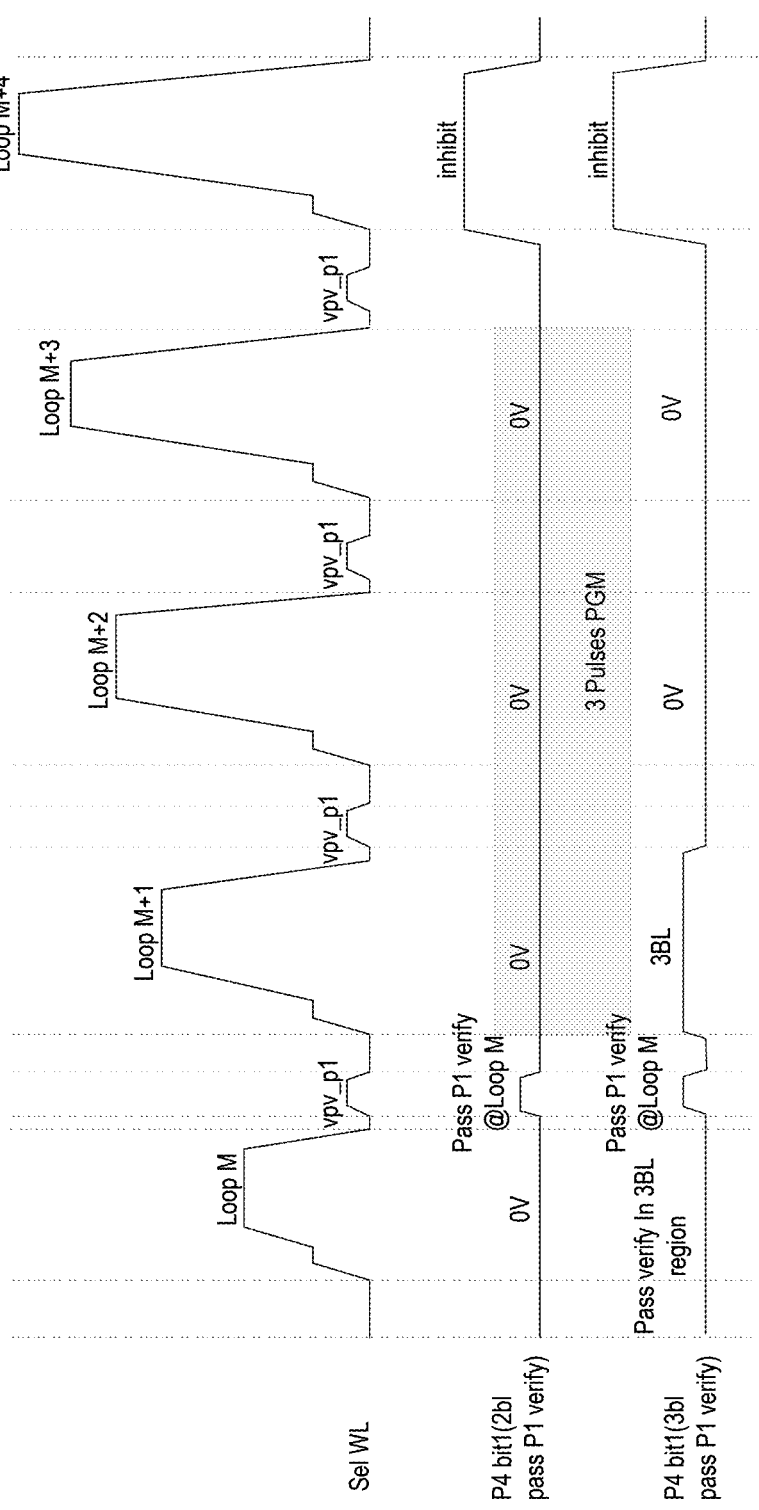
FIG. 3G illustrates an example voltage scheme applied to the memory device, according to some implementations of the present disclosure.
Figure 3H:
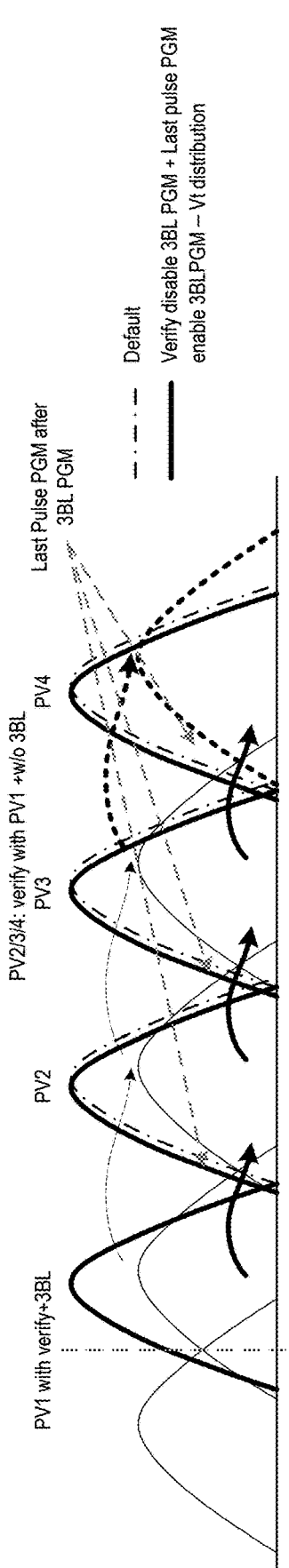
FIG. 3H illustrates a Vt distribution showing an example voltage scheme applied to the memory device, according to some implementations of the present disclosure.

In some implementations, as shown in FIG. 3G, the first bit line bias voltage is applied to memory cells only during the first of the program pulses being applied to the memory cells. For example, the first bit line bias voltage is applied to a first bit line corresponding to the second memory cell during applying the first (e.g., the only one) program pulse to the second memory cell. The first bit line bias voltage is applied to the first bit line corresponding to the third memory cell during applying the first (e.g., the first of the two) program pulse to the third memory cell. And the first bit line bias voltage is applied to the first bit line corresponding to the fourth memory cell during applying the first (e.g., the first of the three) program pulse to the fourth memory cell. The default bit line bias voltage is applied to the memory cells during applying the rest of the pre-determined number of program pulses to the memory cells. In some implementations, the default bit line bias voltage is 0V.

Figure 3I:
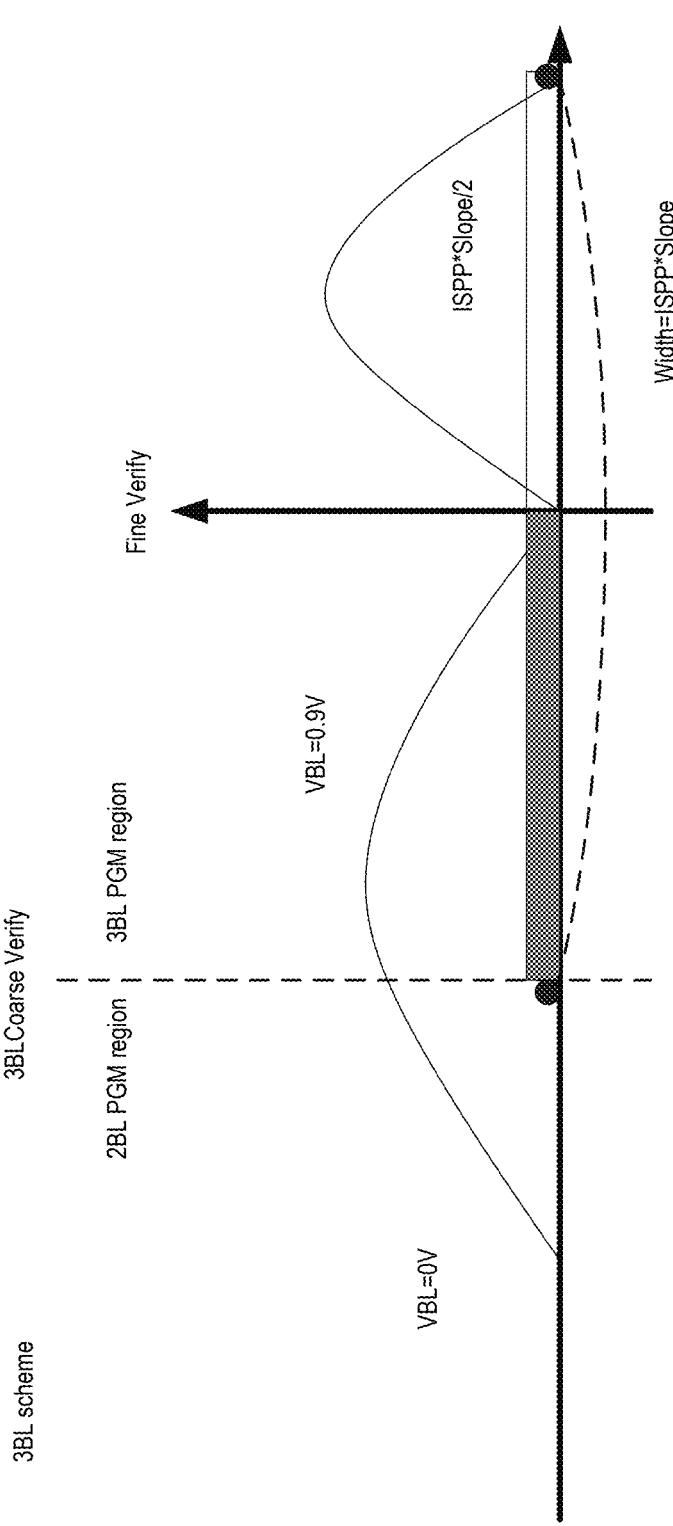
FIG. 3I illustrates a Vt distribution showing an example voltage scheme, according to some implementations of the present disclosure.

In some implementations, the first bit line bias voltage (e.g., the 3BL bias voltage) is determined based on cell information of the target group of memory cells except the first memory cell (e.g., the second memory cell, the third memory cell, the fourth memory cell, etc.). In some implementations, the cell information includes an initial threshold voltage distribution of the memory cells, or a program speed of the memory cells. In some implementations, the cell information is obtained before the first memory cell passes the first verification under the first verify voltage. For example, as shown in FIG. 3I, the cell information can be obtained by determining whether the memory cell is in 2BL program region or in 3BL program region. For example, it can determine that the second memory cell corresponding to the second program state and the fourth memory cell corresponding to the fourth program state may need to be applied with 3BL bias voltage scheme, while the third memory cell corresponding to the third program state may not. It is also noted that if the memory cells correspond to bit lines that are not applied with 3BL bias voltage, a default bit line voltage is applied to those memory cells. The default bit line voltage is different from the 3BL bias voltage. In some implementations, the 3BL bias voltage is larger than 0V and smaller than 2.2V. For example, the 3BL bias voltage includes 0.1, 0.2, 0.3, 0.4, 0.5, 0.6, 0.7, 0.8, 0.9, 1.0, 1.1, 1.2, 1.3, 1.4, 1.5, 1.6, 1.7, 1.8, 1.9, 2.0, or 2.1 V.

Figure 3J:
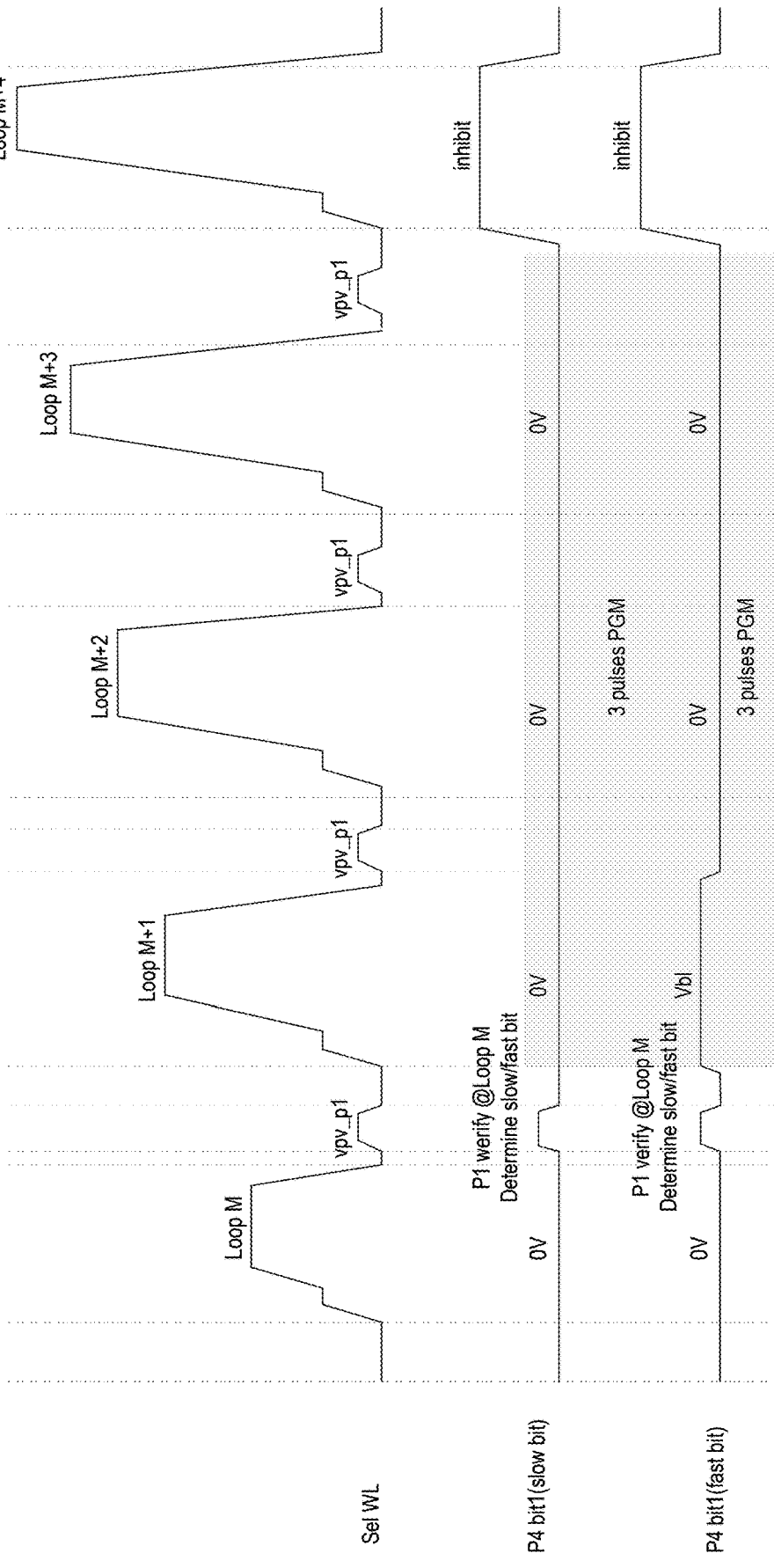
FIG. 3J illustrates an example voltage scheme applied to the memory device, according to some implementations of the present disclosure.

FIG. 3J illustrates another example method of operating the memory device, according to some implementations of the present disclosure. In this implementation, the first bit line bias voltage is applied to bit lines (e.g., a first bit line) corresponding to memory cells except the first memory cell (e.g., the second memory cell) of the target group of memory cells during applying a first of the pre-determined number of program pulse to the selected word line corresponding to the second memory cell. The first bit line bias voltage is applied to memory cells only during the first of the program pulses being applied to the memory cells. For example, the first bit line bias voltage is applied to the first bit line corresponding to the second memory cell during applying the first (e.g., the only one) program pulse to the second memory cell. The first bit line bias voltage is applied to the first bit line corresponding to the third memory cell during applying the first (e.g., the first of the two) program pulse to the third memory cell. And the first bit line bias voltage is applied to the first bit line corresponding to the fourth memory cell during applying the first (e.g., the first of the three) program pulse to the fourth memory cell. The default bit line bias voltage is applied to the memory cells during applying the rest of the pre-determined number of program pulses to the memory cells. In this implementation, the first bit line bias voltage is different from the 3BL bias voltage in the previous implementation. It is noted that these two implementations can be implemented separately or in combination.

As shown in FIG. 3J, taking the fourth memory cell corresponding to the fourth program state, for example, after the fourth memory cell is programmed and later is verified under a first verify voltage for the first program state, three program pulses are applied to the fourth memory cell. And, during the first program pulse being applied to the fourth memory cell, a first bit line voltage is applied to the first bit line corresponding to the fourth memory cell. The first bit line voltage is different from the default bit line voltage. And after the verification and applying program pulses, the fourth memory cell is inhibited from programming in the subsequent program phase by applying a program inhibit signal to the bit line corresponding to the fourth memory cell.

Figure 3K:
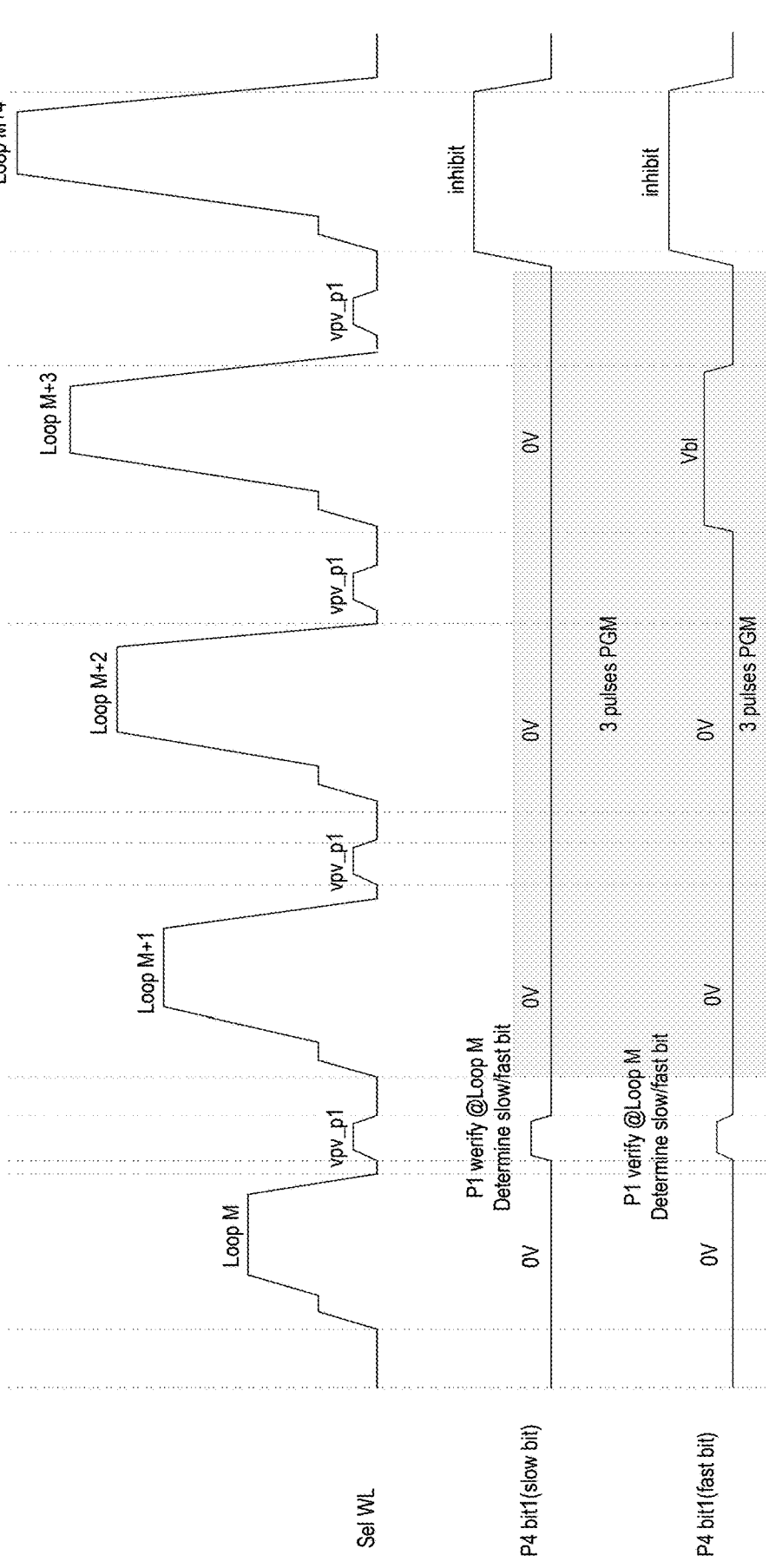
FIG. 3K illustrates an example voltage scheme applied to the memory device, according to some implementations of the present disclosure.

FIG. 3K illustrates another example method of operating the memory device, according to some implementations of the present disclosure. In this implementation, the first bit line bias voltage is applied to bit lines (e.g., a first bit line) corresponding to memory cells except the first memory cell (e.g., the second memory cell) of the target group of memory cells during applying a last of the pre-determined number of program pulse to the selected word line corresponding to the second memory cell. The first bit line bias voltage is applied to memory cells only during the last of the program pulses being applied to the memory cells. For example, the first bit line bias voltage is applied to the first bit line corresponding to the second memory cell during applying the last (e.g., the only one) program pulse to the second memory cell. The first bit line bias voltage is applied to the first bit line corresponding to the third memory cell during applying the last (e.g., the second of the two) program pulse to the third memory cell. And the first bit line bias voltage is applied to the first bit line corresponding to the fourth memory cell during applying the last (e.g., the third of the three) program pulse to the fourth memory cell. The default bit line bias voltage is applied to the memory cells during applying the rest of the pre-determined number of program pulses to the memory cells. In some implementations, the default bit line bias voltage is 0V.

As shown in FIG. 3K, taking the fourth memory cell corresponding to the fourth program state, for example, after the fourth memory cell is programmed and later is verified under a first verify voltage for the first program state, three program pulses are applied to the fourth memory cell. And, during the third program pulse being applied to the fourth memory cell, a first bit line voltage is applied to the first bit line corresponding to the fourth memory cell. The first bit line voltage is different from the default bit line voltage. And, after the verification and applying program pulses, the fourth memory cell is inhibited from programming in the subsequent program phase by applying a program inhibit signal to the bit line corresponding to the fourth memory cell.

Figure 3L:
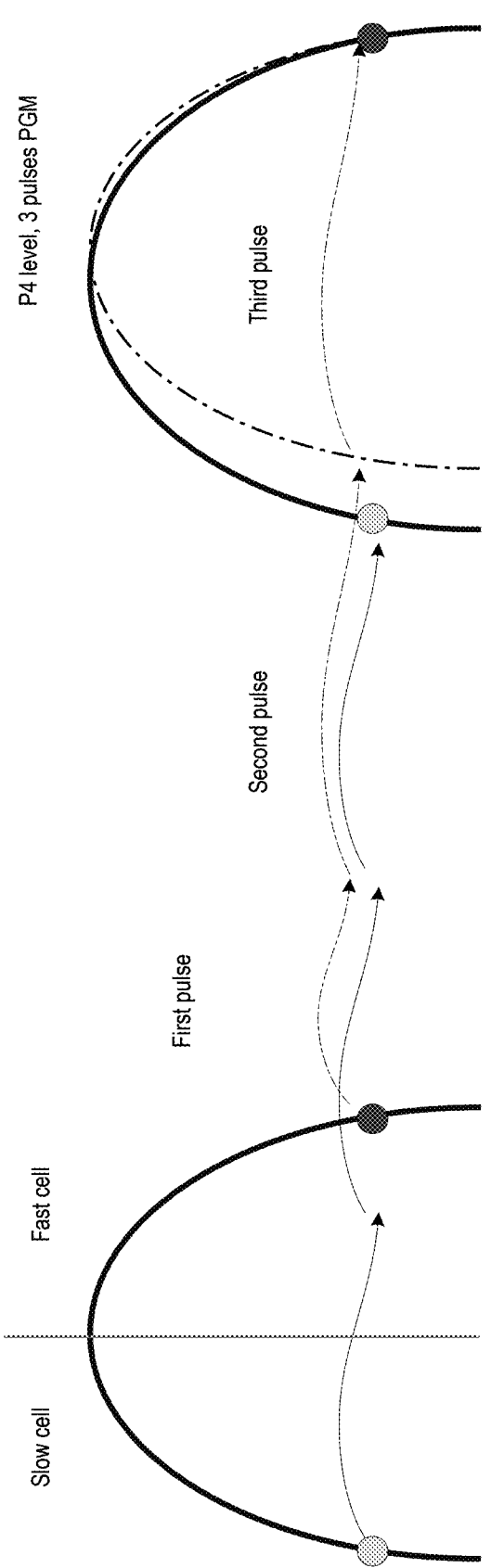
FIG. 3L illustrates a Vt distribution showing an example voltage scheme applied to the memory device, according to some implementations of the present disclosure.

In some implementations, the first bit line bias voltage is determined based on cell information of the target group of memory cells except the first memory cell (e.g., the second memory cell, the third memory cell, the fourth memory cell, etc.). In some implementations, the cell information includes an initial threshold voltage distribution of the memory cells, or a program speed of the memory cells. In some implementations, the cell information is obtained before the first memory cell passes the first verification under the first verify voltage. For example, as shown in FIG. 3L, the cell information can be obtained by determining whether the memory cell is a slow cell or a fast cell. For example, it can determine that the second memory cell corresponding to the second program state and the fourth memory cell corresponding to the fourth program state are fast cells and may need to be applied with the first bit line bias voltage, while the third memory cell corresponding to the third program state may not. And, in response to determining that the fourth memory cell corresponding to P4 is a fast cell, and the first bit line bias voltage is applied during the application of the first program pulse, the Vt distribution of the fast cell (i.e., the fourth memory cell) is thus compressed and becomes narrower. In some implementations, the first bit line bias voltage is larger than 0V and smaller than 2.2V. For example, the first bit line bias voltage includes 0.1, 0.2, 0.3, 0.4, 0.5, 0.6, 0.7, 0.8, 0.9, 1.0, 1.1, 1.2, 1.3, 1.4, 1.5, 1.6, 1.7, 1.8, 1.9, 2.0, or 2.1V.

FIG. 4A illustrates a flowchart of an example method 400 of operating the memory device, according to some implementations of the present disclosure. In some implementations, method 400 is the first programming operation. That is, a second programming operation can be applied to the memory device after performing method 400.

Method 400 starts at operation 402, in which a first program voltage is applied to a selected word line corresponding to a target group of memory cells. The target group of memory cells are selected memory cells in the current program operation. In some implementations, the target group of memory cells includes a first memory cell, a second memory cell, a third memory cell, and a fourth memory cell.

Next, referring to operation 404 in which a first verify voltage is applied to the selected word line corresponding to the target group of memory cells. For example, the first, second, third, and fourth memory cells are applied with the first verify voltage and pass the verification. In some implementations, these memory cells that pass the verification with the first verify voltage are not verified again after applying program pulses. For instance, the bit lines coupled to these memory cells are applied with a verify prohibit voltage (e.g., 0V or lower than certain bit line voltages during the normal verification process), such that these memory cells are not verified during the subsequent verification.

Next, referring to operation 406 in which a pre-determined number of program pulses is applied to the selected word line corresponding to the memory cells of the first target group of memory cells except the first memory cell (e.g., the second memory cell, third memory cell, or fourth memory cell).

While the selected word line is applied with program pulses, the first memory cell is program prohibited (e.g., by applying a program prohibit voltage, for example, a high voltage Vdd, to a bit line that coupled to the first memory cell). After the second memory cell is applied with one program pulse, the second memory cell is program prohibited (e.g., by applying a program prohibit voltage to a bit line coupled to the second memory cell). After the third memory cell is applied with two program pulses, the third memory cell is program prohibited (e.g., by applying a program prohibit voltage to a bit line coupled to the third memory cell). Next, the fourth memory cell is applied with the third program pulse (i.e., three program pulses in total). As such, after the four memory cells are applied with corresponding program pulses and passed the verification with the first verify voltage, the threshold voltages of the four memory cells are all distributed at least in their corresponding intermediate program states. Next, an additional program process such as a second program operation (e.g., a fine programming) may be applied to the four memory cells so that the four memory cells can be programmed to their corresponding target program states.

In some implementations, the pre-determined number of program pulses applied to memory cells includes n program pulse that is applied to (n+1)th memory cell, where n is an integer greater than 0. For example, in implementations that the first target group of memory cells include four memory cells, the second memory cell is applied with one program pulse, the third memory cell is applied with two program pulses, and the fourth memory cell is applied with three program pulses. In some implementations, at least one memory cell of the nth memory cell is applied with at least one program pulse. The greater n is, the more program pulses are applied to the nth memory cells. For example, the fourth memory cell receives more program pulses than the third memory cell, second memory cell, or first memory cell.

Next, referring to operation 408 in which a first bit line bias voltage is applied to a first bit line corresponding to the memory cells of the target group of memory cells except the first memory cell (e.g., the second memory cell, third memory cell, or fourth memory cell) during applying a last of the pre-determined number of program pulse to the selected word line corresponding to the memory cells of the target group of memory cells except the first memory cell (e.g., the second memory cell). For example, the first bit line bias voltage is applied to the first bit line corresponding to the second memory cell during applying the last (e.g., the only one) program pulse to the second memory cell. The first bit line bias voltage can be applied to the first bit line corresponding to the third memory cell during applying the last (e.g., the second of the two) program pulse to the third memory cell. And, the first bit line bias voltage can be applied to the first bit line corresponding to the fourth memory cell during applying the last (e.g., the third of the three) program pulse to the fourth memory cell. The default bit line bias voltage is applied to the memory cells during applying the rest of the pre-determined number of program pulses to the memory cells. In some implementations, the first bit line bias voltage herein is a 3BL bias voltage. And, the first bit line bias voltage can be determined based on the cell information of at least the second memory cell and can be obtained before the first memory cell passes a first verification under the first verify voltage. In some implementations, the cell information includes an initial threshold voltage distribution of the memory cells, or a program speed of the memory cells. In some implementations, the default bit line bias voltage is 0V.

FIG. 4B illustrates a flowchart of an example method 410 of operating the memory device, according to some implementations of the present disclosure.

Method 410 starts at operation 412, in which it is determined that a first group of memory cells are programmed faster than a second group of memory cells. The first group of memory cells and the second group of memory cells correspond to the first bit line. In some implementations, the first group of memory cells are those fast memory cells described above, while the second group of memory cells are those slow memory cells described above.

Next, referring to operation 414 in which a first program voltage is applied to a selected word line corresponding to a target group of memory cells. For example, a first target group of memory cells are selected memory cells in the current program operation. In some implementations, the first target group of memory cells includes the first group of memory cells and the second group of memory cells, which include a first memory cell, a second memory cell, a third memory cell, and a fourth memory cell. For example, the first group of memory cells includes at least one memory cell of the first target group of memory cells (e.g., the fourth memory cell).

Next, referring to operation 416 in which a first verify voltage is applied to the selected word line corresponding to the target group of memory cells. For example, the first, second, third, and fourth memory cells are applied with the first verify voltage and pass the verification. In some implementations, these memory cells that pass the verification with the first verify voltage are not verified again after applying program pulses. For instance, the bit lines coupled to these memory cells are applied with a verify prohibit voltage (e.g., 0V or lower than certain bit line voltages during the normal verification process), such that these memory cells are not verified during the subsequent verification.

Next, referring to operation 418 in which a pre-determined number of program pulses is applied to the selected word line corresponding to the memory cells of the first group of memory cells except the first memory cell (e.g., the second memory cell, third memory cell, or fourth memory cell).

While the selected word line is applied with program pulses, the first memory cell is program prohibited (e.g., by applying a program prohibit voltage, for example, a high voltage Vdd, to a bit line that coupled to the first memory cell). After the second memory cell is applied with one program pulse, the second memory cell is program prohibited (e.g., by applying a program prohibit voltage to a bit line coupled to the second memory cell). After the third memory cell is applied with two program pulses, the third memory cell is program prohibited (e.g., by applying a program prohibit voltage to a bit line coupled to the third memory cell). Next, the fourth memory cell is applied with the third program pulse (i.e., three program pulses in total). As such, after the four memory cells are applied with corresponding program pulses and passed the verification with the first verify voltage, the threshold voltages of the four memory cells are all distributed at least in their corresponding intermediate program states. Next, an additional program process such as a second program operation (e.g., a fine programming) may be applied to the four memory cells so that the four memory cells can be programmed to their corresponding target program states.

In some implementations, the pre-determined number of program pulses applied to memory cells includes n program pulse that is applied to (n+1)th memory cell, where n is an integer greater than 0. For example, in implementations that the first target group of memory cells include four memory cells, the second memory cell is applied with one program pulse, the third memory cell is applied with two program pulses, and the fourth memory cell is applied with three program pulses.

Next, referring to operation 420 in which a first bit line bias voltage is applied to a first bit line corresponding to memory cells of the target group of memory cells except the first memory cell (e.g., second memory cell) during applying a first of the pre-determined number of program pulses to the selected word line corresponding to the memory cells of the target group of memory cells except the first memory cell (e.g., second memory cell). For example, the first bit line bias voltage is applied to the first bit line corresponding to the second memory cell during applying the first program pulse to the second memory cell. The first bit line bias voltage can be applied to the first bit line corresponding to the third memory cell during applying the first program pulse to the third memory cell. And the first bit line bias voltage can be applied to the first bit line corresponding to the fourth memory cell during applying the first program pulse to the fourth memory cell. The default bit line bias voltage is applied to the memory cells during applying the rest of the pre-determined number of the program pulses to the memory cells. In some implementations, the first bit line bias voltage herein is not a 3BL bias voltage. And, the first bit line bias voltage can be determined based on the cell information of at least the second memory cell and can be obtained before the first memory cell passes a first verification under the first verify voltage. Also, it can be determined based on operation 412 which memory cell is a fast memory cell (e.g., the first group of memory cells) and which memory cell is a slow memory cell (e.g., the second group of memory cells) can be determined. In some implementations, the cell information includes an initial threshold voltage distribution of the memory cells, or a program speed of the memory cells.

FIG. 5 illustrates a block diagram of a system 500 having a memory device, according to some aspects of the present disclosure. System 500 can be a mobile phone, a desktop computer, a laptop computer, a tablet, a vehicle computer, a gaming console, a printer, a positioning device, a wearable electronic device, a smart sensor, a virtual reality (VR) device, an argument reality (AR) device, or any other suitable electronic devices having storage therein. As shown in FIG. 5, system 500 can include a host 508 and a memory system 502 having one or more memory devices 504 and a memory controller 506. Host 508 can be a processor of an electronic device, such as a central processing unit (CPU), or a system-on-chip (SoC), such as an application processor (AP). Host 508 can be configured to send or receive the data to or from memory device 504.

Memory devices 504 can be any memory devices disclosed herein, such as memory devices 100. In some implementations, each memory device 504 includes a memory device, as described above in detail.

Memory controller 506 is coupled to memory device 504 and host 508 and is configured to control memory device 504, according to some implementations. Memory controller 506 can be any memory controller disclosed herein. Memory controller 506 can manage the data stored in memory device 504 and communicate with host 508. In some implementations, memory controller 506 is designed for operating in a low duty-cycle environment like secure digital (SD) cards, compact Flash (CF) cards, universal serial bus (USB) Flash drives, or other media for use in electronic devices, such as personal computers, digital cameras, mobile phones, etc. In some implementations, memory controller 506 is designed for operating in a high duty-cycle environment SSDs or embedded multi-media-cards (eMMCs) used as data storage for mobile devices, such as smartphones, tablets, laptop computers, etc., and enterprise storage arrays. Memory controller 506 can be configured to control operations of memory device 504, such as read, erase, and program operations. Memory controller 506 can also be configured to manage various functions with respect to the data stored or to be stored in memory device 504 including, but not limited to bad-block management, garbage collection, logical-to-physical address conversion, wear leveling, etc. In some implementations, memory controller 506 is further configured to process error correction codes (ECCs) with respect to the data read from or written to memory device 504. Any other suitable functions may be performed by memory controller 506 as well, for example, formatting memory device 504. Memory controller 506 can communicate with an external device (e.g., host 508) according to a particular communication protocol. For example, memory controller 506 may communicate with the external device through at least one of various interface protocols, such as a USB protocol, an MMC protocol, a peripheral component interconnection (PCI) protocol, a PCI-express (PCI-E) protocol, an advanced technology attachment (ATA) protocol, a serial-ATA protocol, a parallel-ATA protocol, a small computer small interface (SCSI) protocol, an enhanced small disk interface (ESDI) protocol, an integrated drive electronics (IDE) protocol, a Firewire protocol, etc.

Memory controller 506 and one or more memory devices 504 can be integrated into various types of storage devices, for example, be included in the same package, such as a universal Flash storage (UFS) package or an eMMC package. That is, memory system 502 can be implemented and packaged into different types of end electronic products. In one example as shown in FIG. 6A, memory controller 506 and a single memory device 504 may be integrated into a memory card 602. Memory card 602 can include a PC card (PCMCIA, personal computer memory card international association), a CF card, a smart media (SM) card, a memory stick, a multimedia card (MMC, RS-MMC, MMCmicro), an SD card (SD, miniSD, microSD, SDHC), a UFS, etc. Memory card 602 can further include a memory card connector 604 coupling memory card 602 with a host (e.g., host 508 in FIG. 5). In another example as shown in FIG. 6B, memory controller 506 and multiple memory devices 504 may be integrated into an SSD 606. SSD 606 can further include an SSD connector 608 coupling SSD 606 with a host (e.g., host 508 in FIG. 5). In some implementations, the storage capacity and/or the operation speed of SSD 606 is greater than those of memory card 602.

The foregoing description of the specific implementations can be readily modified and/or adapted for various applications. Therefore, such adaptations and modifications are intended to be within the meaning and range of equivalents of the disclosed implementations, based on the teaching and guidance presented herein.

The breadth and scope of the present disclosure should not be limited by any of the above-described exemplary implementations, but should be defined only in accordance with the following claims and their equivalents.

What is claimed is:

1. A method of operating a memory device, comprising:
applying a first program voltage to a selected word line corresponding to a target group of memory cells, wherein the target group of memory cells comprises a first memory cell and a second memory cell, a target program state of the first memory cell is a first program state, and a target program state of the second memory cell is a second program state, wherein the memory cells in the second program state require a higher threshold voltage than those of the first program state to program, and each verify voltage corresponds to at least one program state;
applying a first verify voltage to the selected word line corresponding to the target group of memory cells;
applying a pre-determined number of program pulses to the selected word line corresponding to the second memory cell; and
applying a first bit line bias voltage to a first bit line corresponding to the second memory cell of the target group of memory cells during applying a first or a last of the pre-determined number of program pulses to the selected word line corresponding to the second memory cell.

2. The method of claim 1, further comprising:
based on cell information of the second memory cell, determining the first bit line bias voltage.

3. The method of claim 1, wherein:
the first bit line bias voltage is different from a first bit line voltage applied to the first bit line corresponding to the second memory cell of the target group of memory cells during applying the pre-determined number of program pulse other than the first or the last of the pre-determined number of program pulses to the selected word line corresponding to the second memory cell.

4. The method of claim 1, further comprising:
in response to that the first memory cell passes a first verification under the first verify voltage, inhibiting programming the first memory cell;
in response to that the second memory cell passes the first verification under the first verify voltage, applying the pre-determined number of program pulses to the selected word line corresponding to the second memory cell; and
inhibiting programming the second memory cell.

5. The method of claim 1, wherein applying a pre-determined number of program pulses to the selected word line corresponding to the second memory cell comprises:
applying n program pulse to the selected word line corresponding to the (n+1)th memory cell of the target group of memory cells, wherein n is an integer greater than 0.

6. The method of claim 1, wherein the first bit line bias voltage is a 3-bit-line (3BL) bias voltage, and wherein applying the first bit line bias voltage to the first bit line corresponding to the second memory cell of the target group of memory cells is during applying the last of the pre-determined number of program pulse to the selected word line corresponding to the second memory cell.

7. The method of claim 6, wherein the 3BL bias voltage is larger than 0V and smaller than 2.2V.

8. The method of claim 1, wherein applying the first bit line bias voltage to the first bit line corresponding to the second memory cell of the target group of memory cells is during applying the first of the pre-determined number of program pulse to the selected word line corresponding to the second memory cell.

9. The method of claim 8, wherein the first bit line bias voltage is larger than 0V and smaller than 2.2V.

10. The method of claim 8, wherein during applying the first of the pre-determined number of program pulses to the selected word line corresponding to the second memory cell, determining the first bit line bias voltage is based on:

determining that the first bit line corresponds to a first
group of memory cells that are programmed faster than
a second group of memory cells, wherein the target
group of memory cells comprises the first group of
memory cells and the second group of memory cells.

11. A memory device, comprising:
a memory cell array comprising memory cells; and
a peripheral circuit coupled to the memory cell array,
wherein the peripheral circuit is configured to:
apply a first program voltage to a selected word line
corresponding to a target group of memory cells,
wherein the target group of memory cells comprises a
first memory cell and a second memory cell, a target
program state of the first memory cell is a first program
state, and a target program state of the second memory
cell is a second program state, wherein the memory
cells in the second program state require a higher
threshold voltage than those of the first program state to
program, and each verify voltage corresponds to at
least one program state;
apply a first verify voltage to the selected word line
corresponding to the target group of memory cells;
apply a pre-determined number of program pulses to the
selected word line corresponding to the second memory
cell; and
apply a first bit line bias voltage to a first bit line
corresponding to the second memory cell of the target
group of memory cells during applying a first or a last
of the pre-determined number of program pulses to the
selected word line corresponding to the second memory
cell.

12. The memory device of claim 11, wherein the periph-
eral circuit is further configured to:
based on cell information of the second memory cell,
determine the first bit line bias voltage.

13. The memory device of claim 11, wherein:
the first bit line bias voltage is different from a first bit line
voltage applied to the first bit line corresponding to the
second memory cell of the target group of memory cells
during applying the pre-determined number of program
pulse other than the first or the last of the pre-deter-
mined number of program pulses to the selected word
line corresponding to the second memory cell.

14. The memory device of claim 11, wherein the periph-
eral circuit is further configured to:
in response to that the first memory cell passes a first
verification under the first verify voltage, inhibiting
programming the first memory cell;
in response to that the second memory cell passes the first
verification under the first verify voltage, applying the
pre-determined number of program pulses to the
selected word line corresponding to the second memory
cell; and
inhibiting programming the second memory cell.

15. The memory device of claim 11, wherein the periph-
eral circuit configured to apply a pre-determined number of
program pulses to the selected word line corresponding to
the second memory cell is further configured to:

apply n program pulse to the selected word line corre-
sponding to the (n+1)th memory cell of the target group
of memory cells, wherein n is an integer greater than 0.

16. The memory device of claim 11, wherein the first bit
line bias voltage is a 3-bit-line (3BL) bias voltage, and
wherein the peripheral circuit is configured to apply the first
bit line bias voltage to the first bit line corresponding to the
second memory cell of the target group of memory cells
during applying the last of the pre-determined number of
program pulse to the selected word line corresponding to the
second memory cell.

17. The memory device of claim 16, wherein the 3BL bias
voltage is larger than 0V and smaller than 2.2V.

18. The memory device of claim 11, wherein the periph-
eral circuit is configured to apply the first bit line bias
voltage to the first bit line corresponding to the second
memory cell of the target group of memory cells during
applying the first of the pre-determined number of program
pulse to the selected word line corresponding to the second
memory cell.

19. The memory device of claim 18, wherein during
applying the first of the pre-determined number of program
pulse to the selected word line corresponding to the second
memory cell, the peripheral circuit is configured to deter-
mine the first bit line bias voltage based on:
determining that the first bit line corresponds to a first
group of memory cells that are programmed faster than
a second group of memory cells, wherein the target
group of memory cells comprises the first group of
memory cells and the second group of memory cells.

20. A memory system, comprising:
a memory device; and
a memory controller coupled to the memory device,
wherein the memory device comprises:
a memory cell array comprising memory cells; and
a peripheral circuit coupled to the memory cell array,
wherein the peripheral circuit is configured to:
apply a first program voltage to a selected word line
corresponding to a target group of memory cells,
wherein the target group of memory cells comprises a
first memory cell and a second memory cell, a target
program state of the first memory cell is a first program
state, and a target program state of the second memory
cell is a second program state, wherein the memory
cells in the second program state require a higher
threshold voltage than those of the first program state to
program, and each verify voltage corresponds to at
least one program state;
apply a first verify voltage to the selected word line
corresponding to the target group of memory cells;
apply a pre-determined number of program pulse to the
selected word line corresponding to the second memory
cell; and
apply a first bit line bias voltage to a first bit line
corresponding to the second memory cell of the target
group of memory cells during applying a first or a last
of the pre-determined number of program pulse to the
selected word line corresponding to the second memory
cell.

* * * * *